United States Patent [19]

Abe et al.

[11] Patent Number: 5,590,048

[45] Date of Patent: Dec. 31, 1996

[54] BLOCK EXPOSURE PATTERN DATA EXTRACTING SYSTEM AND METHOD FOR CHARGED PARTICLE BEAM EXPOSURE

[75] Inventors: Tomohiko Abe; Hiroshi Yasuda; Kiichi Sakamoto; Yoshihisa Oae, all of Kawasaki, Japan

[73] Assignee: Fujitsu Limited, Kawasaki, Japan

[21] Appl. No.: 71,262

[22] Filed: Jun. 4, 1993

[30] Foreign Application Priority Data

Jun. 5, 1992 [JP] Japan .................................. 4-145833
Jun. 8, 1992 [JP] Japan .................................. 4-147655
Sep. 21, 1992 [JP] Japan .................................. 4-251224

[51] Int. Cl.$^6$ .............................. G06F 17/50; G06K 9/00
[52] U.S. Cl. ........................ 364/489; 364/488; 364/490; 364/491; 382/190; 382/209; 250/492.22
[58] Field of Search .................. 382/10, 21, 30, 382/33, 34, 144, 145, 147, 190, 202, 209; 364/488–491; 250/492.1, 492.2, 492.22, 492.3, 370.01, 370.08

[56] References Cited

U.S. PATENT DOCUMENTS

| | | | |
|---|---|---|---|
| 4,119,946 | 10/1978 | Taylor | 340/146.3 Q |
| 4,135,147 | 1/1979 | Riganati et al. | 340/146.3 E |
| 4,280,186 | 7/1981 | Hidai et al. | 364/518 |
| 4,291,231 | 9/1981 | Kawashima et al. | 250/492 A |
| 4,493,105 | 1/1985 | Beall et al. | 382/21 |
| 4,538,232 | 8/1985 | Koyama | 364/491 |
| 4,543,660 | 9/1985 | Maeda | 382/34 |
| 4,651,289 | 3/1987 | Maeda et al. | 364/513.5 |
| 4,718,019 | 1/1988 | Fillion et al. | 364/491 |
| 4,759,075 | 7/1988 | Lipkie et al. | 382/46 |
| 4,776,020 | 10/1988 | Kosaka et al. | 382/1 |
| 4,805,224 | 2/1989 | Koezuka et al. | 382/8 |
| 4,820,928 | 4/1989 | Ooyama et al. | 250/492.2 |
| 4,878,177 | 10/1989 | Ikenaga et al. | 364/489 |
| 5,014,327 | 5/1991 | Potter et al. | 382/14 |
| 5,109,431 | 4/1992 | Nishiya et al. | 382/30 |
| 5,173,582 | 12/1992 | Sakamoto et al. | 219/121.25 |

OTHER PUBLICATIONS

Doerffer et al., "Time Efficient Method for MOS Circuit Extraction", 'IEEE Int'l Symposium on Circuits and Systems, May 1993, pp. 1983–1986.

*Primary Examiner*—Kevin J. Teska
*Assistant Examiner*—Leigh Marie Garbowski
*Attorney, Agent, or Firm*—Staas & Halsey

[57] ABSTRACT

In a block exposure pattern extracting system applied to a charged-particle beam exposure system having a block mask including a plurality of transparent stats having different shapes, a comparator unit compares first vectors connecting one of apexes of an input exposure pattern to other apexes thereof with second vectors connecting a reference point which is one of apexes of a unit block exposure pattern to other apexes of the unit block exposure pattern. A determining unit determines whether or not the first vectors coincide with the second vectors. An extracting unit extracts the input exposure pattern as the unit block exposure pattern when the determining unit determines that the first vectors coincide with the second vectors.

42 Claims, 24 Drawing Sheets

FIG. 1  PRIOR ART
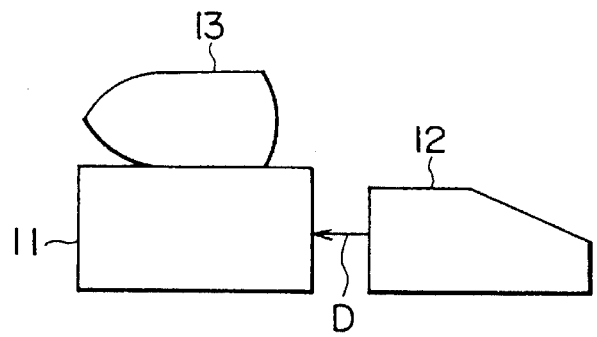
FIG. 2  PRIOR ART
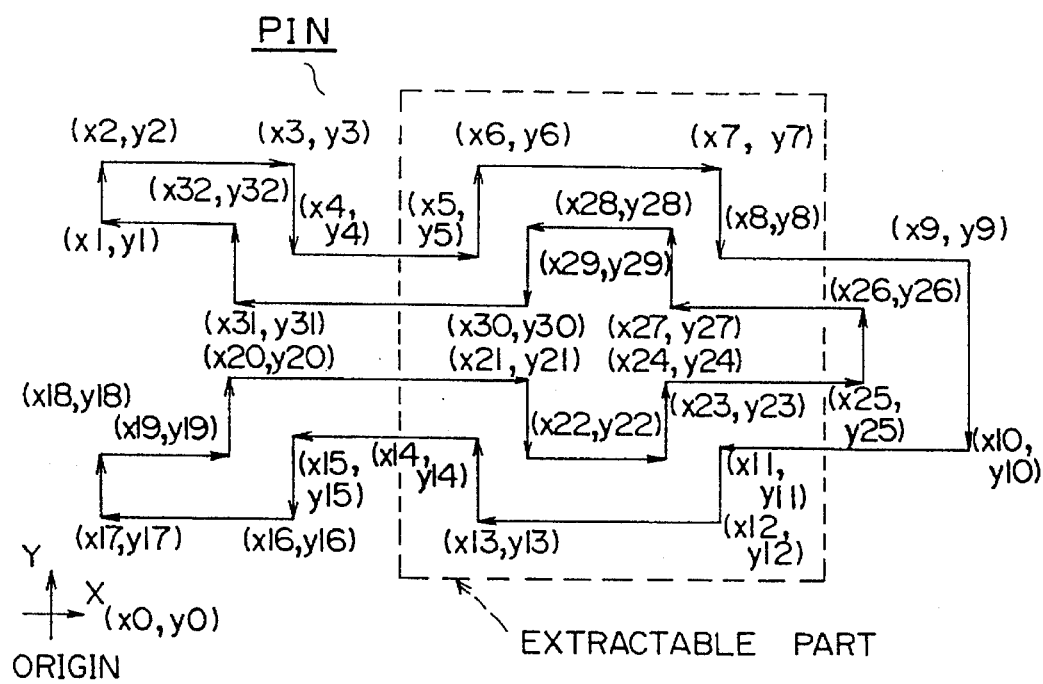
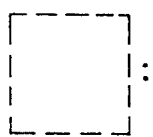 : UNIT BLOCK EXPOSURE PATTERN

UNIT BLOCK EXPOSURE PATTERN

INFORMATION D TO BE OPERATED

× APEXES

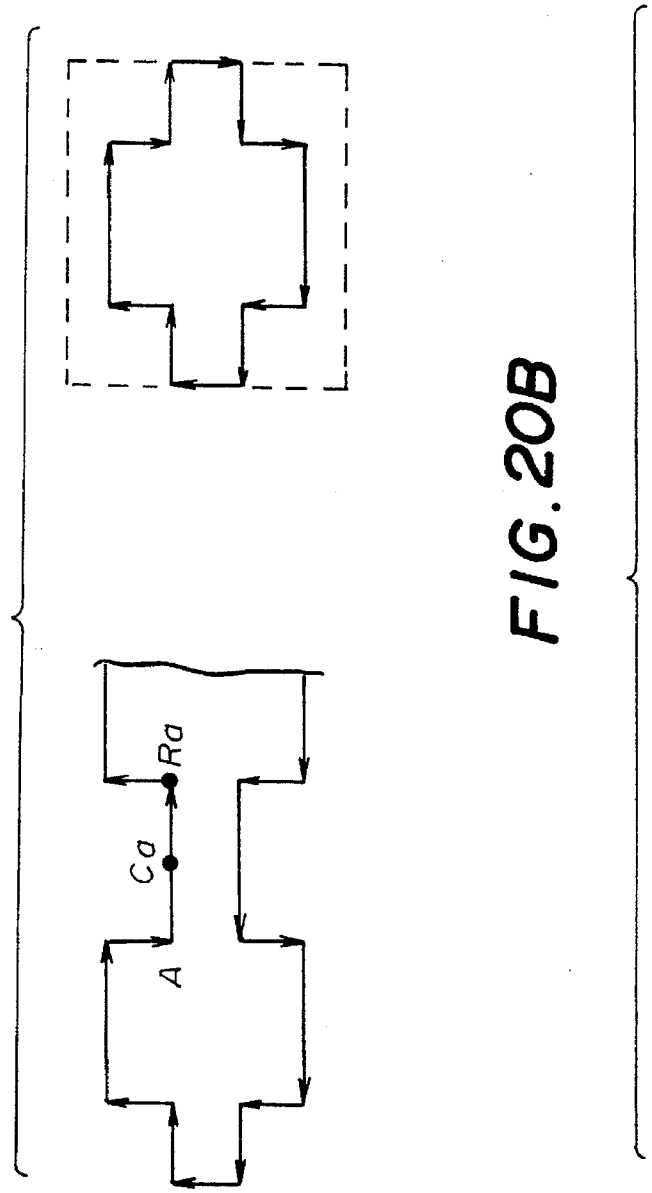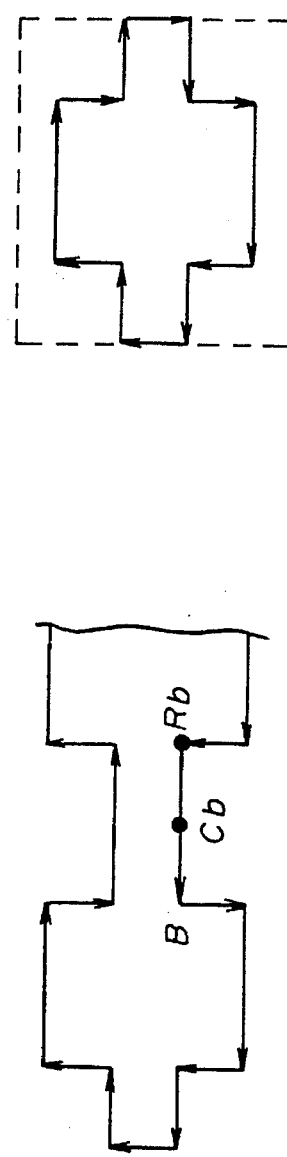
FIG.20A
FIG.20B

1

BLOCK EXPOSURE PATTERN DATA EXTRACTING SYSTEM AND METHOD FOR CHARGED PARTICLE BEAM EXPOSURE

BACKGROUND OF THE INVENTION

Field of the Invention

The present invention generally relates to a charged particle beam exposure method and system, such as an electron beam exposure method and system. More particularly, the present invention is concerned with a process for extracting appropriate block pattern exposure data used when a wafer exposure is performed by projecting an electron beam onto a transparent mask placed above a wafer.

A variable rectangle-shaped electron beam exposure process is widely used, in which a pattern is continuously drawn on a wafer by means of an electron beam in a "single stroke of the brush" manner.

Recently, an electron beam exposure system performing a block exposure process has been developed in order to produce highly-integrated circuits, such as large scale integrated circuits. In the block exposure process, a block mask (transparent mask) arranged at the center of an optical axis of the exposure system is used. The block mask has a plurality of slits having respective shapes corresponding to unit block patterns (hereinafter, the term "unit" will sometimes be omitted for the sake of simplicity). One of the slits of the block mask is selected on the basis of a pattern to be drawn on a wafer, and an electron beam is projected onto the selected slit of the block mask. The electron beam passes through the selected slit, and is projected onto the wafer. The pattern actually formed on the wafer is a reduced version of the selected slit.

Block exposure data used in the block exposure process is generated in the following manner. Parts (unit blocks) which can be exposed in the block unit are manually extracted from a pattern shown in the design drawing. Then, the design drawing is manually rearranged taking into account the extracted parts of the pattern. As the number of block patterns (that is, the number of slits having different shapes) increases, it becomes more difficult to manually extract parts corresponding to the block patterns and manually rearrange the original design drawing. The above extracting and rearranging procedures may be performed by means of a computer. However, a very complicated sequence will be needed to perform the above extracting and rearranging procedures.

A further description will now be given of the conventional extracting and rearranging procedure. FIG. 1 is a block diagram of a system for performing the conventional extracting and rearranging procedure, and FIG. 2 is a diagram showing how a unit block corresponding to one silt of the mask is extracted from a pattern.

The system shown in FIG. 1 is made up of a computer system 11. a keyboard 12, and a display unit 13. An operator inputs information D to be operated contained in an exposure pattern (exposure data) to the computer system 11 by means of the keyboard 12. The computer system 11 calculates a predetermined operation on the input exposure data, and obtains coordinates values of apexes of the exposure pattern, which coordinate values are then displayed on the display unit 13.

FIG. 2 shows an exposure pattern PIN. The exposure data of the exposure pattern PIN includes coordinates of an exposure reference point defined as an origin O(x0, y0), and coordinates of apexes of exposure pattern PIN with respect to the origin O, (x1, y1), (x2, y2), ... , (x32, y32). Further, the exposure data includes vector information concerning vectors connecting the adjacent apexes to each other. Hence, the exposure data indicates the contour of the exposure pattern PIN.

FIG. 3 shows a unit block exposure pattern to be extracted from the exposure pattern PIN shown in FIG. 2. The operator sees the exposure pattern PIN displayed on the display unit 13, and manually extracts the unit block exposure pattern from the exposure pattern PIN. In this case, the operator selects predetermined unit block exposure patterns one by one, and compares the selected unit block pattern with the exposure pattern PIN. When it is determined that the block pattern shown in FIG. 3 can be extracted from the exposure pattern PIN, as shown in FIG. 2, exposure data indicating a part of the exposure pattern PIN corresponding to the block pattern is replaced by data indicating the identified block pattern. In this case, the coordinate data shown in FIG. 4 to be replaced by the block pattern is specified so that the corresponding part of the pattern PIN is segmented as a block pattern. In the above-mentioned manner, the exposure data input to the computer system 11 is completely accessed and it is determined whether or not the exposure data can be replaced by the block exposure data.

However, the above-mentioned conventional extracting and rearranging method and system have the following disadvantages. First, it is necessary to manually make a decision as to whether or not block patterns can be extracted from exposure data originally designed for the variable rectangle-shaped beam exposure system. As the integration density of LSI circuits increases, it becomes more difficult to manually make the above decision and the time necessary to complete the extracting and rearranging operation greatly increases. Second, when there is no extractable block pattern, it is necessary to compare all the block patterns with the exposure pattern within a specified range, one by one, until the block patterns cannot be extracted at all. The time necessary for the above comparing operation is wasteful.

SUMMARY OF THE INVENTION

It is a general object of the present invention to provide an exposure block pattern data extracting system and method in which the above disadvantages are eliminated.

A specific object of the present invention is to provide an exposure block pattern data extracting system and method capable of efficiently extracting exposure block pattern data at high speed even when a large number of block patterns is provided.

The above objects of the present invention are achieved by a block exposure pattern extracting system applied to a charged-particle beam exposure system having a block mask including a plurality of transparent slits having different shapes, the block exposure data extracting system comprising: comparator means for comparing first vectors connecting one of apexes of an input exposure pattern to other apexes thereof with second vectors connecting a reference point which is one of apexes of a unit block exposure pattern to other apexes of the unit block exposure pattern; determining means, coupled to the comparator means, for determining whether or not the first vectors coincide with the second vectors; and extracting means, coupled to the determining means, for extracting the input exposure pattern as the unit block exposure pattern when the determining means determines that the first vectors coincide with the second vectors.

The above objects of the present invention are also achieved by a block exposure pattern extracting method applied to a charged-particle beam exposure system having a block mask including a plurality of transparent slits having different shapes, the block exposure data extracting method comprising the steps of: (a) comparing first vectors connecting one of apexes of an input exposure pattern to other apexes thereof with second vectors connecting a reference point which is one of apexes of a unit block exposure pattern to other apexes of the unit block exposure pattern; (b) determining whether or not the first vectors coincide with the second vectors; and (c) extracting the input exposure pattern as the unit block exposure pattern when the step (b) determines that the first vectors coincide with the second vectors.

BRIEF DESCRIPTION OF THE DRAWINGS

Other objects, features and advantages of the present invention will become more apparent from the following detailed description when read in conjunction with the accompanying drawings, in which:

FIG. 1 (PRIOR ART) is a conventional system used for extracting block pattern data from exposure data of an exposure pattern and rearranging the exposure data with extracted block pat tern data;

FIG. 2 (PRIOR ART) is a diagram illustrating exposure data from which a block pattern is extracted;

FIGS. 20A and 20B are diagrams showing how information concerning cutting points are given;

DESCRIPTION OF THE PREFERRED EMBODIMENTS

First, a charged particle beam exposure system will be described in order to facilitate understanding of the present invention.

Figure 3:
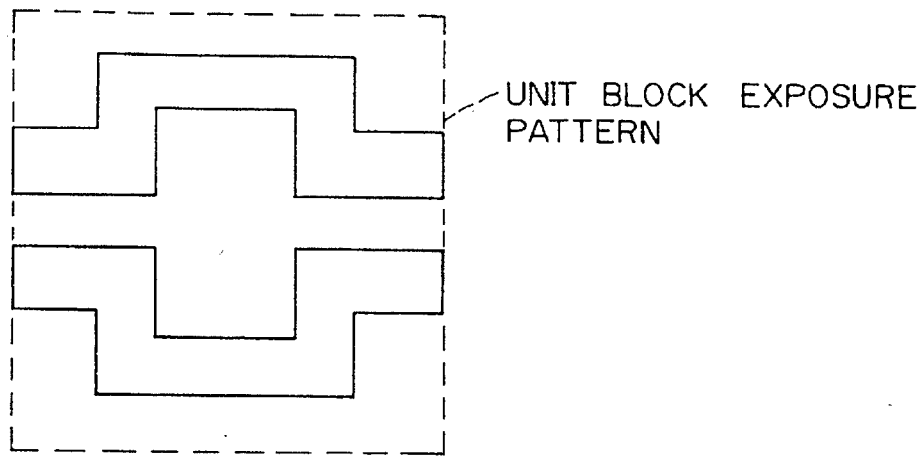
FIG. 3 (PRIOR ART) is a diagram illustrating a block pattern.
Figure 4:
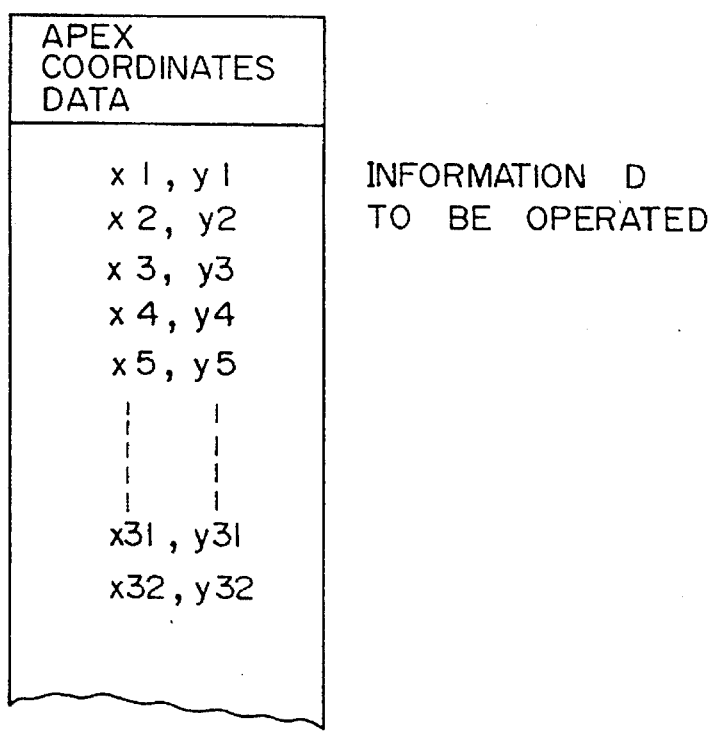
FIG. 4 (PRIOR ART) is a diagram illustrating coordinate data.
Figure 5:
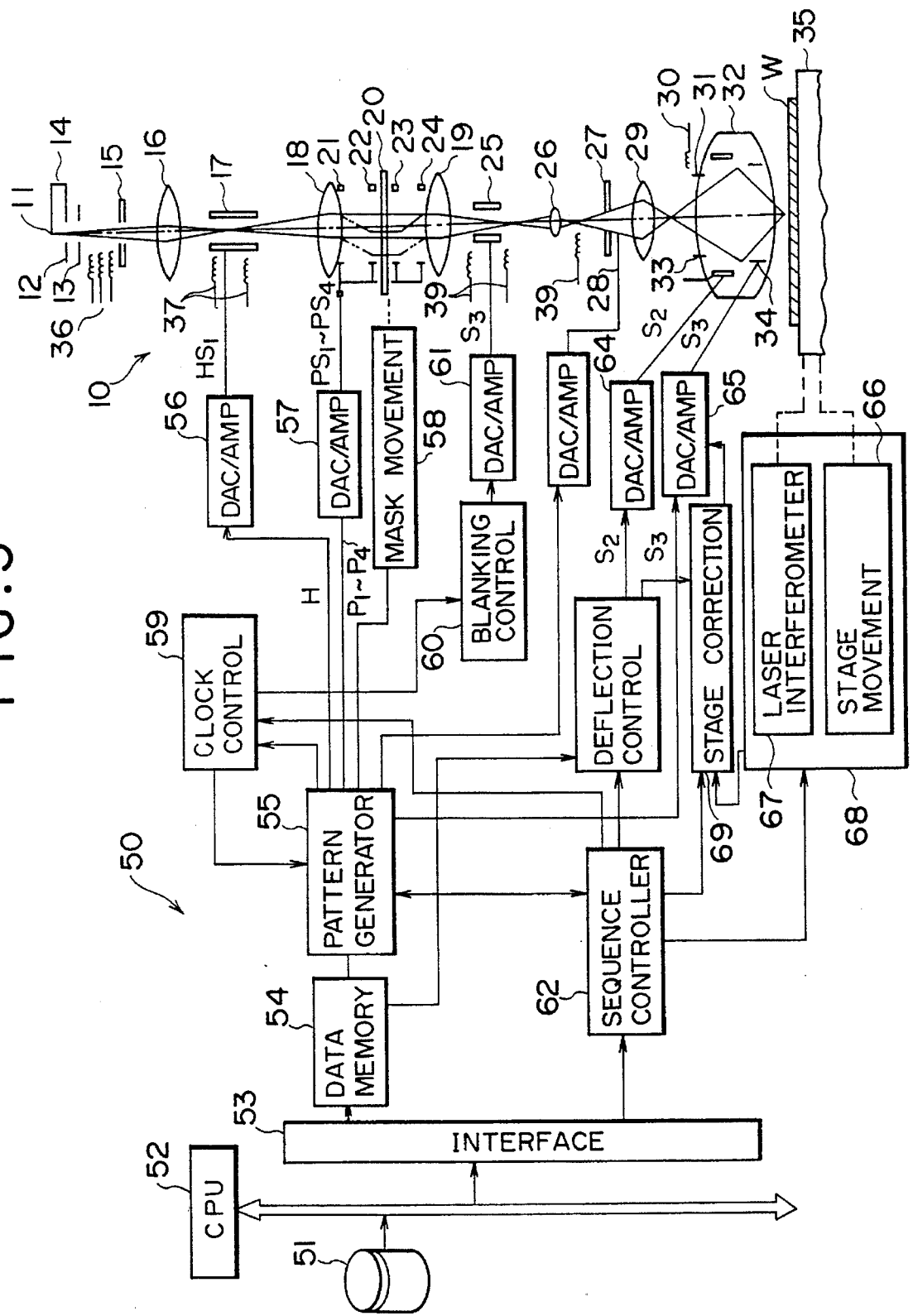
FIG. 5 is a block diagram of a charged particle beam exposure system to which the present invention is applied.

FIG. 5 is a block diagram of an electron beam exposure system, which is mainly comprised of an exposure unit 10 and a control unit 50.

The exposure unit 10 includes a charged particle beam generating source 14, which comprises of a cathode electrode 11, a grid electrode 12, and an anode 13. A first slit 15 shapes a charged particle beam (hereinafter simply referred to as a beam) emitted from the source 14 into a beam having a rectangular cross section. A first lens 16 converges the shaped beam from the first slit 15. A slit deflector 17 deflects the shaped beam so that the position of the beam on a transparent mask 20 is controlled in accordance with a deflection signal S1. A second lens 18 and a third lens 19 opposite to each other are located below the slit defector 17. The transparent mask 20 is located between the second lens 18 and the third lens 19 so that the transparent mask 20 can be moved in the horizontal directions.

A first defector 21 and a second deflector 22 are positioned above the transparent mask 20, and a third defector 23 and a fourth deflector 24 are positioned below the transparent mask 20. The first, second, third and fourth deflectors 21, 22, 23 and 24 deflect the beam between the second lens 18 and the third lens 19 in accordance with pieces of position information P1, P2, P3 and P4, so that one of a plurality of transparent slits formed on the transparent mask 20 is selected.

A blanking electrode 25 cuts off the beam or allows the beam to pass through the blanking electrode 25 in accordance with a blanking signal. A fourth lens 26 is provided below the blanking electrode 25. An aperture 27 is provided below the fourth lens 26. Further, a refocusing coil 28, a fifth lens 29, a dynamic focusing coil 30, a dynamic stig coil 31 and a sixth lens 32 are provided in this order. A main deflector 33 and a sub-deflector 34 position the beam on a wafer W in accordance with exposure position signals S2 and S3, respectively. A stage 35, on which the wafer is placed, is movable in X and Y directions. Further, first through fourth alignment coils 36–39 are provided, as shown in FIG. 5.

The control unit 50 includes a storage medium 51, a CPU (Central Processing Unit) 52, an interface 53, a data memory 54, a pattern generator 55, amplifiers 56 and 57, a mask moving mechanism 58. Further, the control unit 50 includes a clock control circuit 59, a blanking control circuit 60, an amplifier 61, a sequence controller 62, a deflection control circuit 63, amplifiers 64 and 65, a stage control circuit 68, and a stage correction unit 69.

The storage medium 51 stores design data on an integrated circuit device. The CPU 52 integrally controls the beam. The interface 53 transfers a variety of information which is input under the control of the CPU 52. For example, such information may comprise drawing position information concerning a pattern to be drawn on the wafer W (drawing pattern information), and mask information concerning the transparent mask 20. The data memory 54 stores the drawing pattern information and the mask information transferred via the interface 53. The pattern generator 55 specifies one of the transparent slits of the transparent mask 20 on the basis of the drawing pattern information and the mask information, and generates mask projection position data P1–P4 indicating the selected transparent slit. Further, the pattern generator 55 generates wafer exposure position data S3 indicating the position on the wafer W at which the pattern indicated by the drawing pattern information is located. Furthermore, the pattern generator 55 performs a process for computing a correction value H based on the shape of the pattern to be drawn and the shape of the selected (specified) transparent slit. Moreover, the pattern generator 55 carries out processes other than the process mentioned above, and functions as a specification means, a hold means, a computing means, and an output means.

The amplifier 56 derives a corrected deflection signal HS1 from the correction value H, and outputs the corrected deflection signal HS1 in analog form. The amplifier 57 generates deflection signals PS1–PS4 from the projection position data P1–P4, and outputs the deflection signals PS1–PS4 in analog form. The mask moving mechanism 58 moves the transparent mask 20 as necessary. The clock control circuit 59 receives information concerning an exposure time and an exposure standby time, and generates a system clock signal, and a blanking clock signal. The overall exposure system operates in synchronism with the system clock signal. The blanking control circuit 60 generates a blanking timing signal from the blanking clock signal from the clock control circuit 59. The amplifier 61 generates a digital blanking control signal SB from the blanking timing signal.

The sequence controller 62 controls various sequences for exposure. For example, the sequence controller 62 causes the stage control circuit 68 to output a main-deflector deflection information to the data memory on the basis of exposure starting information and exposure ending information transferred via the interface 53 and the pattern generator 56 and to output an instruction signal indicative of a desired stage position to the stage controller 68. Further, the sequence controller 62 causes the stage correction unit 69 to correct the difference between the stage movement position and the main deflection. Furthermore, the sequence controller 62 instructs the clock controller 59 to initiate to output the clock signals to the pattern generator 55 and to stop outputting the clock signals thereto.

The deflection control circuit 63 generates the main deflection signal S2 on the basis of the main deflection information stored in the data memory 54. The amplifiers 64 and 65 generate the exposure position signals S2 and S3 in digital form on the basis of the output signal of the main control circuit 63. The stage control circuit 68 is made up of a stage moving mechanism 66, which moves the stage 35 as necessary, and a laser interferometer 67 for detecting the position of the stage 35. The stage correction unit 69 receives data indicating a main deflection amount from the deflection control circuit 63, and data indicating a stage movement position from the stage control circuit 68.

In operation, the electron beam emitted from the charged particle beam generating source 14 is shaped into a rectangular shape in its cross section by means of the first slit 15. Then, the shaped beam is converged by the first lens 16 and the second lens 18, and is then projected onto the transparent mask 20.

A deflection on the transparent mask 20 within a relatively large area (within an approximately 5 mm×5 mm area) is carried out by the first through fourth deflectors 21–24. A deflection on the transparent mask 20 within a relatively small area (within an approximately 500 μm×500 μm area) is carried out by the slit deflector 17 after the deflection by the first through fourth deflectors 21–24.

When a variable rectangle-shaped beam exposure process is performed in the system shown in FIG. 1, a rectangle-shaped beam having an arbitrary size equal to or less than a 3 μm×3 μm size can be obtained by the slit defector 17.

The beam passing through the transparent mask 20 passes through the blanking electrode 25, and is further diminished by the fourth lens 26. Then, the diminished beam is deflected within a small deflection area approximately equal to a 100 μm×100 μm area by means of the sub-deflector 34. The beam is greatly deflected within an approximately 2 mm×2 mm deflection area by the main deflector 33.

Data on a pattern to be exposed is read from the storage medium 51 by the CPU 52, and is written into the data memory 54. The exposure process is initiated by the sequence controller 62, data indicative of the main deflector deflection position and stored in the data memory 54 is output to the deflection control circuit 63, which outputs the deflection amount data S2. Then, the deflection amount data S2 is output to the main deflection coil 33 via the amplifier 57.

When the output has been settled, the sequence controller 62 instructs the clock control circuit 59 to generate the system clock signal. Hence, pattern data stored in the data memory 54 is output to the pattern generator 55, which generates shot data based on the pattern data supplied to the pattern generator 55.

The shot data includes the position information P1–P4, the correction value H, the exposure position signal S3, shot time data, and shot standby time data. The position information P1–P4 indicates the position on the transparent mask 20 onto which the beam is projected. The correction value H indicates a deflection amount by which the beam projection position is deflected. The exposure position signal S3 is used to deflect the beam shaped by the transparent mask 20 to a desired position on the wafer W. The shot time data indicates a time interval during which the electron beam is being projected onto the wafer W. The shot standby time indicates a time interval necessary for the electrostatic deflector and the electromagnetic deflector to be settled after the signals are applied to these deflectors.

The above-mentioned signal components of the shot data generated by the pattern generator 55 are subjected to a correction process based on a wafer rotation which occurs when the wafer W is placed on the stage 35. The above correction process is carried out by the pattern generator 55. Other correction processes can be performed as necessary. The signals output from the pattern generator 55 are applied to the corresponding amplifiers, which output corresponding analog signals to the corresponding coils or electrodes.

In the variable rectangle-shaped beam exposure, the transparent mask 20 functions as the second slit, and the first through fourth deflectors 21–24 necessary to deflect the beam are not needed. In the block exposure, the beam is projected onto a predetermined block mask, and a block mask pattern is transferred onto a member to be exposed by means of the beam passing through the block mask. The block exposure is intended to ensure high throughput.

Figure 6:
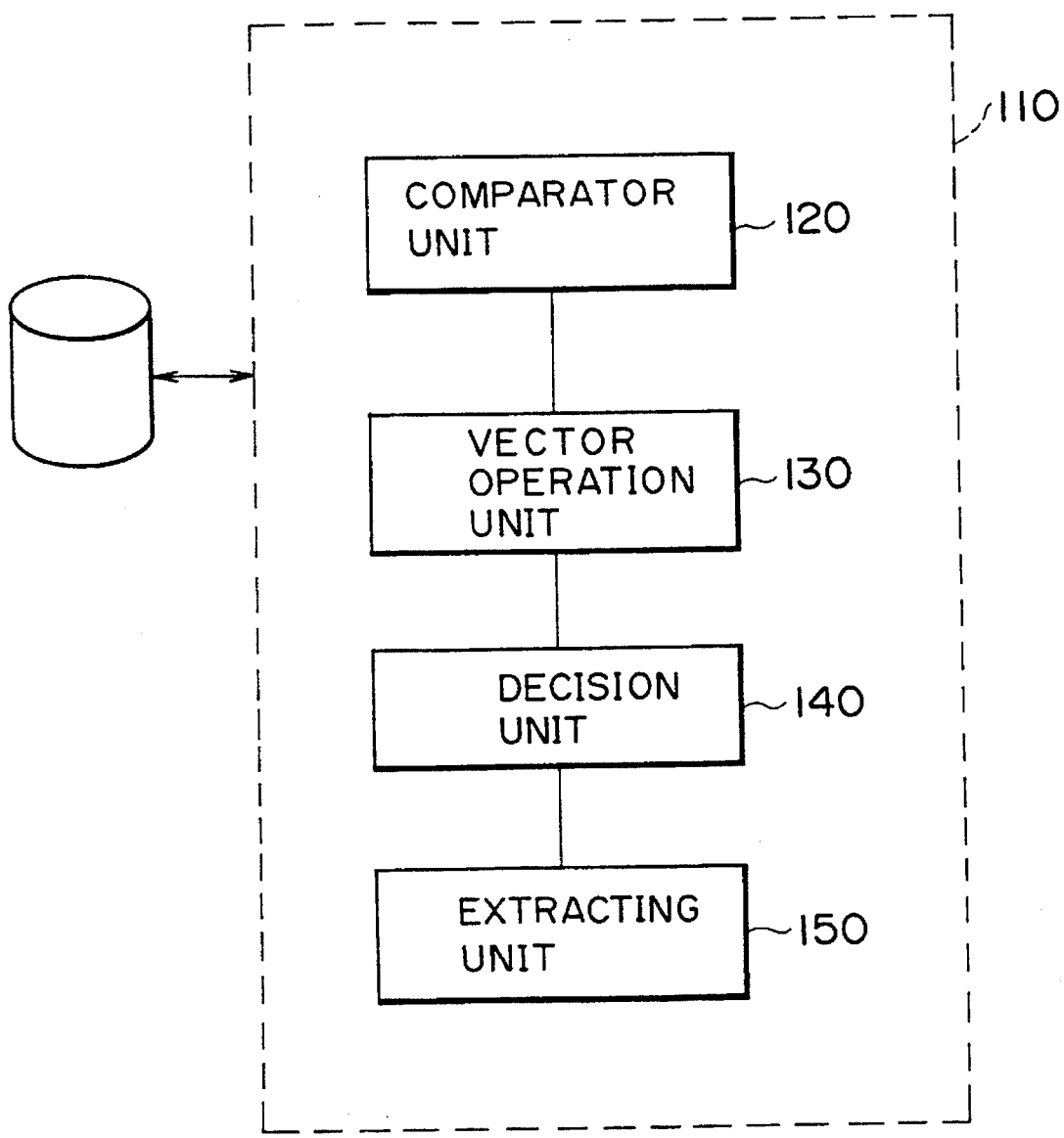
FIG. 6 is a block diagram of a block exposure pattern data extracting system according to a first embodiment of the present invention.

FIG. 6 is a block diagram of a block pattern data extracting system 110 according to a first embodiment of the present invention. The control unit 50 functionally realizes the system 110 shown in FIG. 6. The system 100 comprises a comparator unit 120, a vector operation unit 130, a decision unit 140, and an extracting unit 150.

Figure 7A:
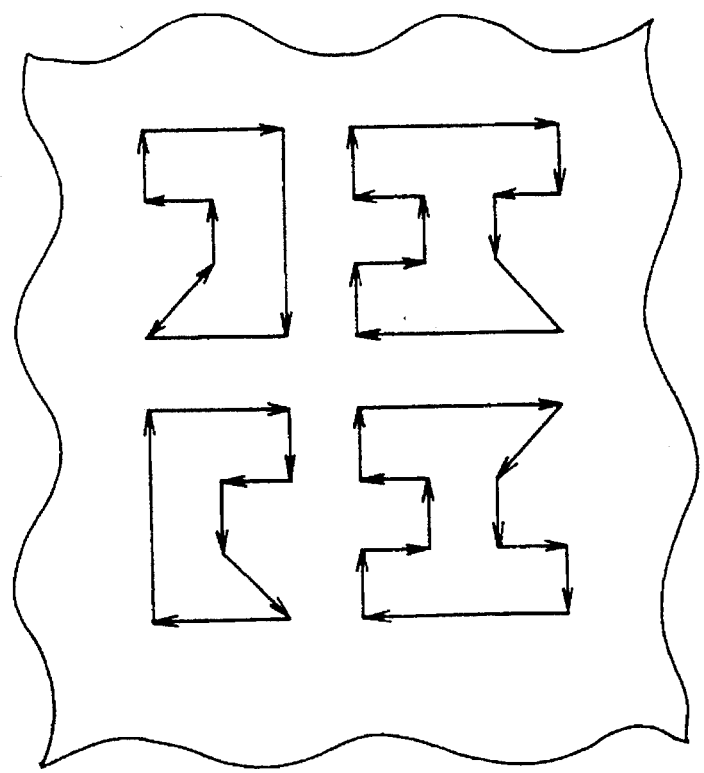
FIG. 7A is a diagram illustrating exposure patterns from which a unit block exposure pattern is extracted.
Figure 7B:
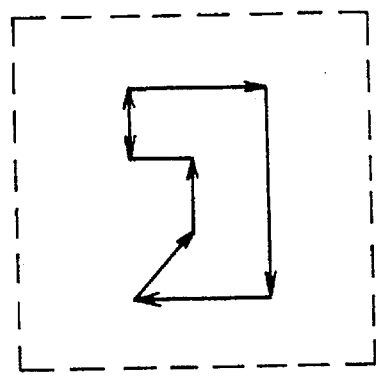
FIG. 7B is a diagram of a unit block exposure pattern.

FIG. 7A illustrates exposure patterns to be processed, and FIG. 7B illustrates a unit block exposure pattern. Information concerning each unit block pattern is defined as follows. As described below, such information contains information concerning a reference point, input and output vectors with respect to the reference point, position vectors, and input and output vectors with respect to each apex other than the reference point. Such information is stored in a storage means beforehand.

Figure 8:
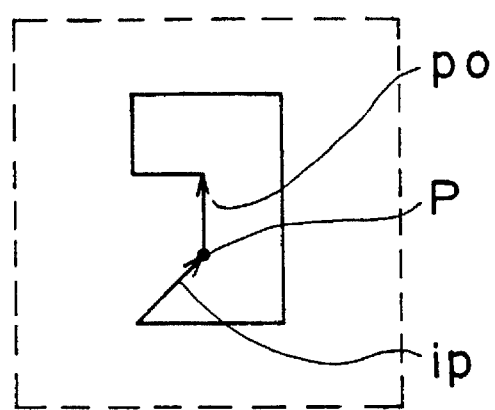
FIG. 8 is a diagram illustrating a reference point of the unit block exposure pattern shown in FIG. 7B.

A predetermined apex of the unit block pattern shown in FIG. 8 is defined as a reference point P, and an input vector ip and an output vector po with respect to the reference point P are also defined. The reference point is a noticeable or distinguishable one of the apexes of each unit block pattern. For example, an apex at which the angle between the input vector ip and the output vector po is greater than 90° is selected as the reference point P of each unit block pattern. It is also possible to select, as the reference point P, an apex at which the ratio of the length of the input vector ip and the output vector op is equal to or greater than 2. By selecting a noticeable or distinguishable point as the reference point, it becomes possible to eliminate unnecessary steps.

Figure 9:
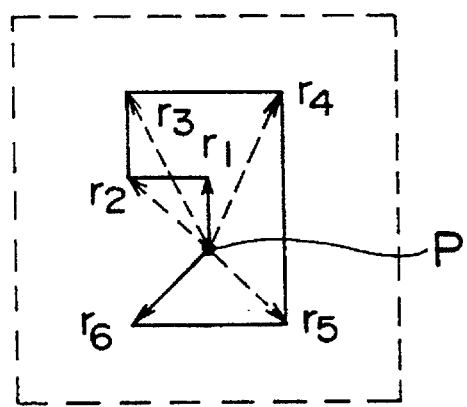
FIG. 9 is a diagram illustrating position vectors connecting the reference point to apexes of the unit block exposure pattern shown in FIG. 7B.

As shown in FIG. 9, for each unit block pattern, position vectors respectively connecting the reference point P to all the apexes other than the reference point P are defined.

Further, input and output vectors as shown in FIG. 7B are defined for each of the apexes other than the reference point P.

Returning now to FIG. 6, input exposure pattern data is read out from a storage medium and applied to the comparator unit 120 of the block pattern extracting system 110. As shown in FIG. 2, the input exposure pattern data includes data indicating the contour of each exposure pattern. The comparator unit 120 selects one of the apexes of an input exposure pattern indicated by the input exposure pattern data. The vector operation unit 130 calculates data indicating the input and output vectors with respect to the selected apex. The input vector comes from the adjacent apex located in the counterclockwise direction along the contour of the input exposure pattern. The output vector goes to the adjacent apex located in the clockwise direction along the contour of the input exposure pattern. Then, the comparator unit 120 compares the input and output vectors of the input exposure pattern with respect to the selected apex with the input and output vectors ip and op with respect to the reference point P of a predetermined one of the unit block exposure patterns. It will now be assumed that the unit block pattern to be compared is the unit block pattern shown in FIG. 8.

Figure 10:
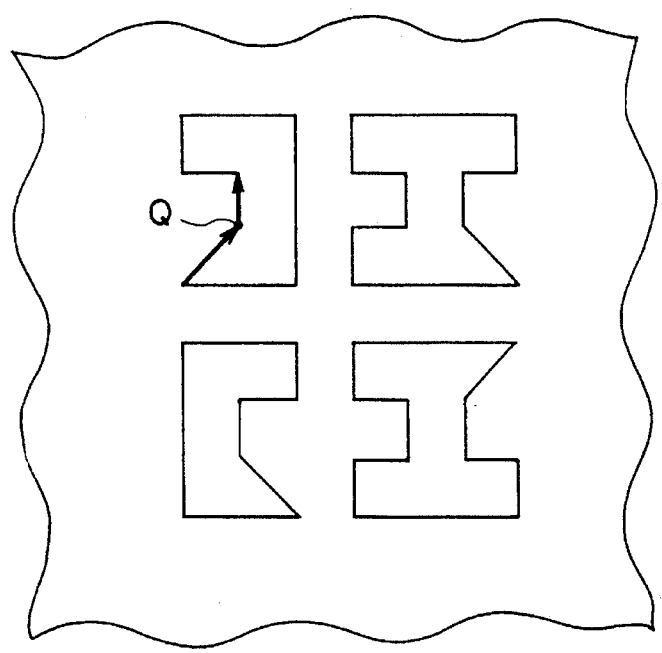
FIG. 10 is a diagram illustrating a designation of a candidate point of an exposure pattern.

When the input and output vectors of the input exposure pattern with respect to the selected apex coincide with the input and output vectors of the unit exposure pattern with respect to the reference point P, the comparator unit 120 selects the selected apex as a candidate point Q, as shown in FIG. 10. If not, the comparator unit 120 selects the next apex of the input exposure pattern, and the above-mentioned process is carried out for the next apex.

Figure 12:
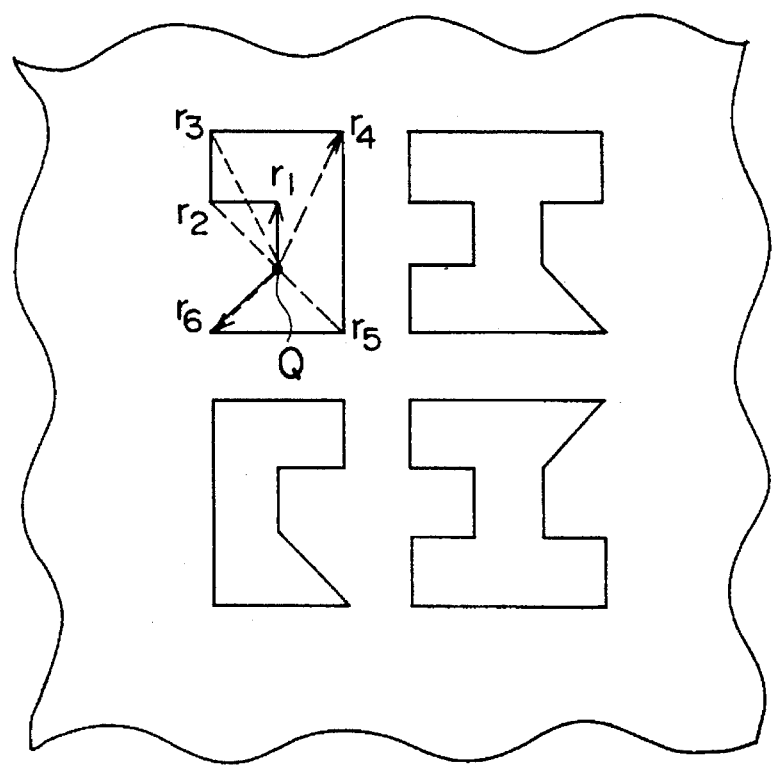
FIG. 12 is a diagram illustrating position vectors connecting the candidate point to apexes of an exposure pattern.

When the candidate point Q is determined, the vector operation unit 130 calculates data indicating position vectors connecting the candidate point Q of the input exposure pattern to each of the other apexes thereof, as shown in FIG. 12. Further, the vector operation unit 130 calculates data indicating input and output vectors with respect to each of the apexes of the input pattern other than the candidate point Q. The decision unit 140 makes a decision as to whether or not the input exposure pattern matches the unit block exposure pattern, and concludes that the input exposure pattern matches the unit block exposure pattern when either the following first decision result or the second decision result is obtained.

Figure 13:
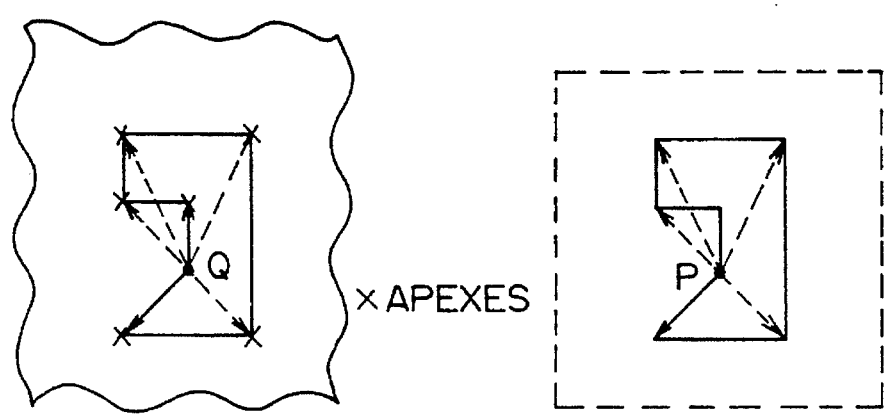
FIG. 13 is a diagram showing an exposure pattern match based on the positions of the apexes of the exposure pattern as well as the number of the apexes.

As shown in FIGS. 12 and 13, the first decision result shows that the apexes of the input exposure pattern indicated by the position vectors extending from the candidate point Q matches the apexes of the unit block exposure pattern indicated by the position vectors extending from the reference point P and that the number of apexes of the input exposure pattern is equal to that of the unit block pattern.

Figure 14:
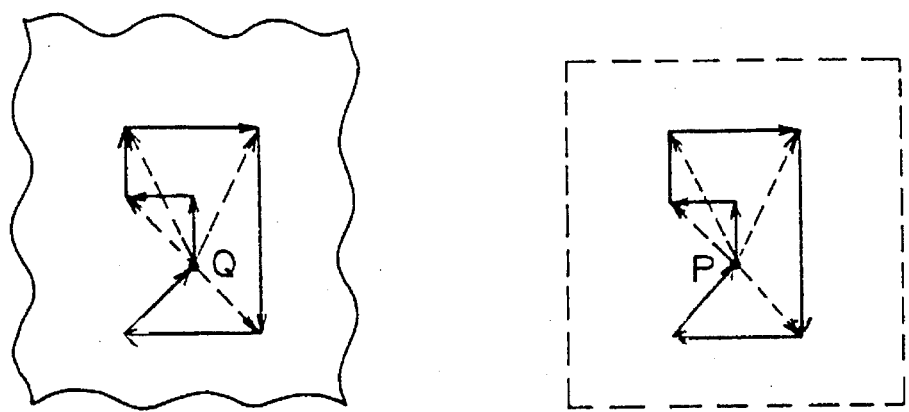
FIG. 14 is a diagram showing an exposure pattern match based on the positions of the apexes of the exposure pattern as well as input and output vectors.

As shown in FIGS. 14, the second decision result shows that the apexes of the input exposure pattern indicated by the position vectors extending from the candidate point Q matches the apexes of the unit block exposure pattern indicated by the position vectors extending from the reference point P and that the input and output vectors with respect to each of the apexes of the input exposure pattern match the input and output vectors with respect to each of the apexes of the unit block exposure pattern.

Figure 11:
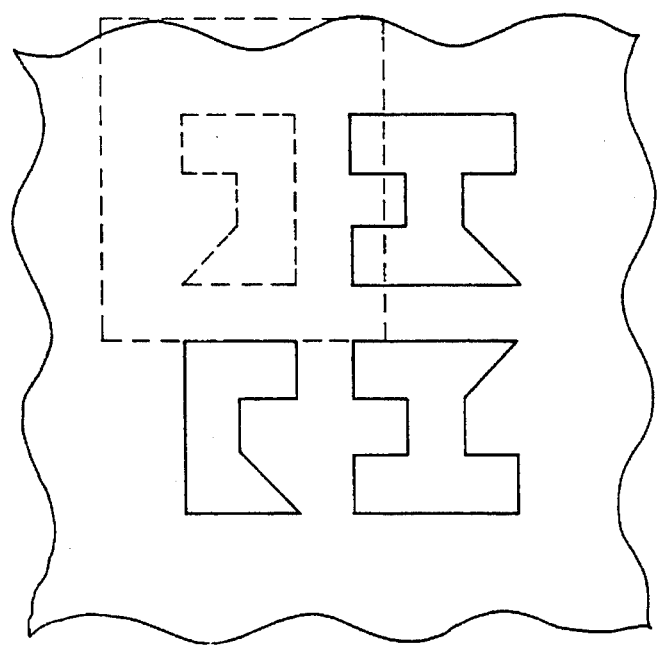
FIG. 11 is a diagram showing how a unit block pattern is extracted.

Then, the extracting unit 150 extracts the identified input exposure pattern, as shown in FIG. 11. The identified pattern may be a part of the input exposure pattern. Data indicating the identified input pattern, that is, the identified unit block exposure pattern includes the position thereof and identification information indicating it.

Figure 15:
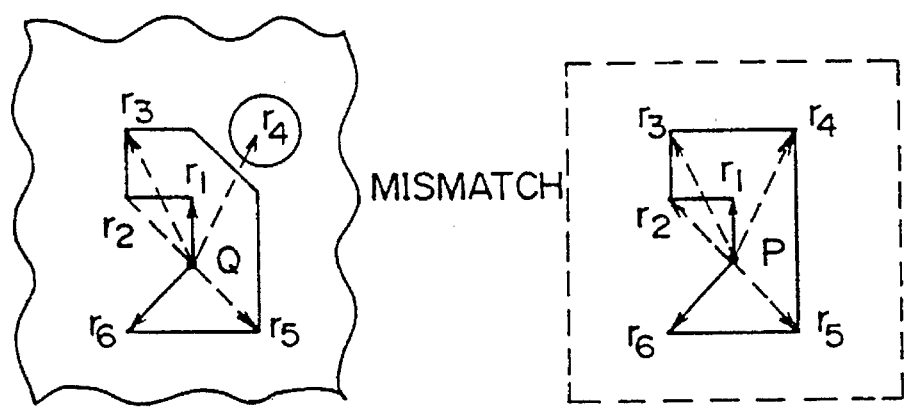
FIG. 15 is a diagram showing an exposure pattern mismatch.

When it is determined that the pattern being processed does not match the unit block pattern being selected on the way of the prosecution of the process shown in FIG. 13 or FIG. 14, the current candidate point Q is discarded and the next candidate point Q located in the clockwise direction is selected. As shown in FIG. 15, when the position vector directed to apex r4 of a pattern does not match the position vector directed to apex r4 of the unit block pattern, the pattern is discarded and the comparing operation on the apexes r5 of the pattern being processed and the unit block pattern is not carried out. Hence, it is possible to efficiently search for a part of the pattern matching one of the unit block patterns at high speed.

According to the first embodiment of the present invention, the system 110 shown in FIG. 6 is functionally embedded in the control unit 50 shown in FIG. 5. In practice, it is preferable to configure the system 110 as follows.

A description will now be given of a second embodiment of the present invention.

According to the aforementioned first embodiment of the present invention, an isolated pattern corresponding to a unit block exposure pattern can be extracted. Hence, the first embodiment is not capable of extracting a unit block pattern from a pattern in which a plurality of patterns, each corresponding to the above unit block pattern, are continuously coupled. Hereinafter, such a pattern is referred to as a continuous pattern. The second embodiment of the present invention is intended to extract a unit block pattern from such a continuous pattern in which a plurality of patterns, each corresponding to the above unit block pattern, are continuously coupled.

Figure 16A:
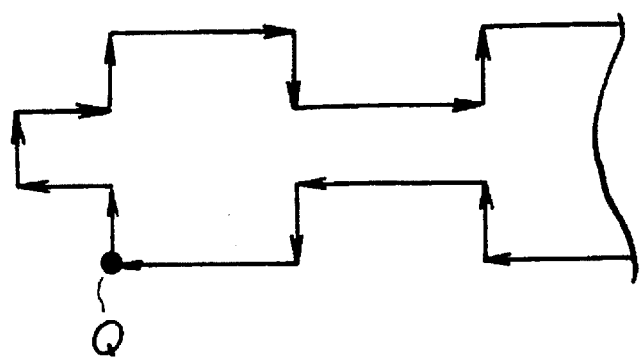
FIGS. 16A and 16B are respectively diagrams showing an input exposure pattern to be processed and a unit block exposure pattern used to explain a second embodiment of the present invention.
Figure 16B:
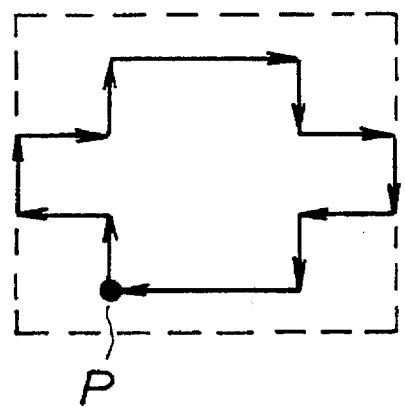

FIG. 16A shows an input exposure pattern to be processed, and FIG. 16B shows a unit block pattern. In FIG. 16A, Q denotes a candidate point, and P in FIG. 16B is the reference point of the unit block pattern.

Figure 17:
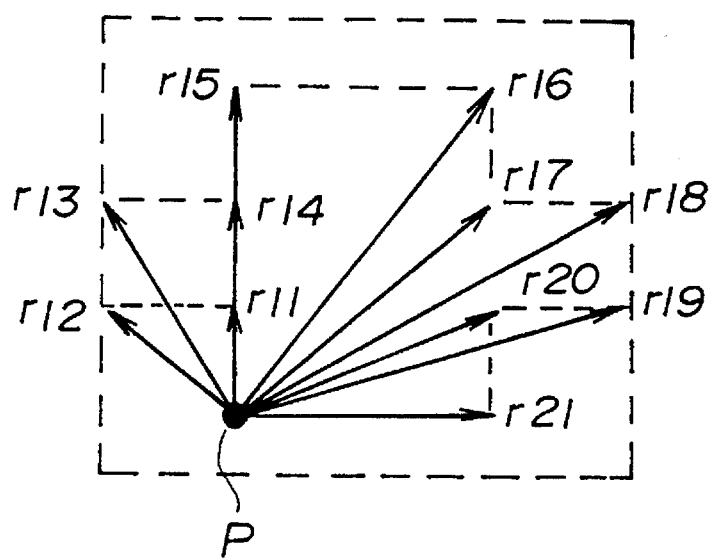
FIG. 17 is a diagram showing position vectors.

FIG. 17 shows position vectors of the unit block exposure pattern shown in FIG. 16B connecting the reference point P to each of the apexes thereof. For each of the apexes of each of the input exposure pattern and the unit block pattern indicated by the position vectors, one input vector terminating at the apex being considered and starting from the apex next to the above apex in the counterclockwise direction, and one output vector starting from the apex being considered and ending at the apex next to the above apex being considered in the clockwise direction. By means of these input and output vectors, the contours of the input pattern and the unit block patterns are defined.

As shown in FIG. 16A, one apex of the input exposure pattern having input and output vectors matching the input and output vectors with respect to the reference point P of the unit block pattern is selected as the candidate point Q by the comparator unit 120. When these input and output vectors do not match, the next candidate point adjacent to the current candidate point Q in the clockwise direction is selected, and the above matching operation is carried out.

When the candidate point Q having the same input and output vectors as the reference point P is identified, position vectors of the input exposure pattern having the origin of the candidate point Q are detected by the vector operation unit 130. Further, input and output vectors with respect to each of the apexes of the input exposure pattern other than the candidate point Q are detected by the vector operation unit 130.

Figure 18A:
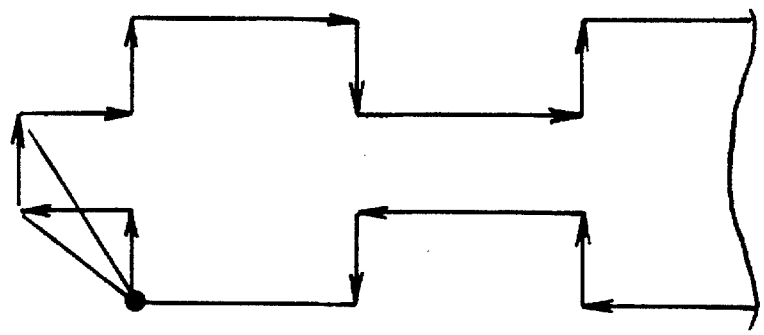
FIGS. 18A and 18B are respectively diagrams of position vectors of the input pattern and the unit block exposure pattern.
Figure 18B:
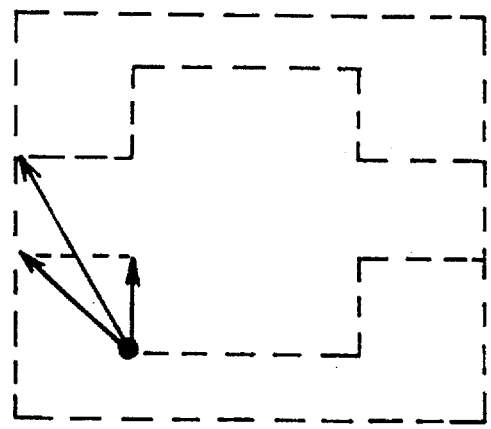

The decision unit 140 shown in FIG. 6 compares the position vectors from the candidate point with the position vectors from the reference point P, as shown in FIGS. 18A and 18B, and determine whether or not the apexes of the input exposure pattern are present at the positions indicated by the position vectors from the reference point P. This determination operation sequentially checks the apexes one by one in the clockwise direction.

Figure 19A:
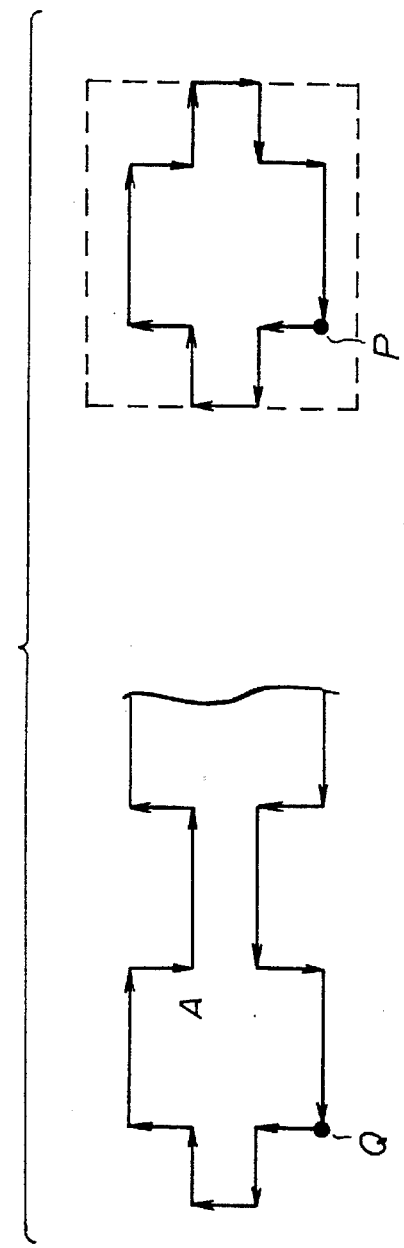
FIGS. 19A and 19B are diagrams for explaining incomplete matching points.
Figure 19B:
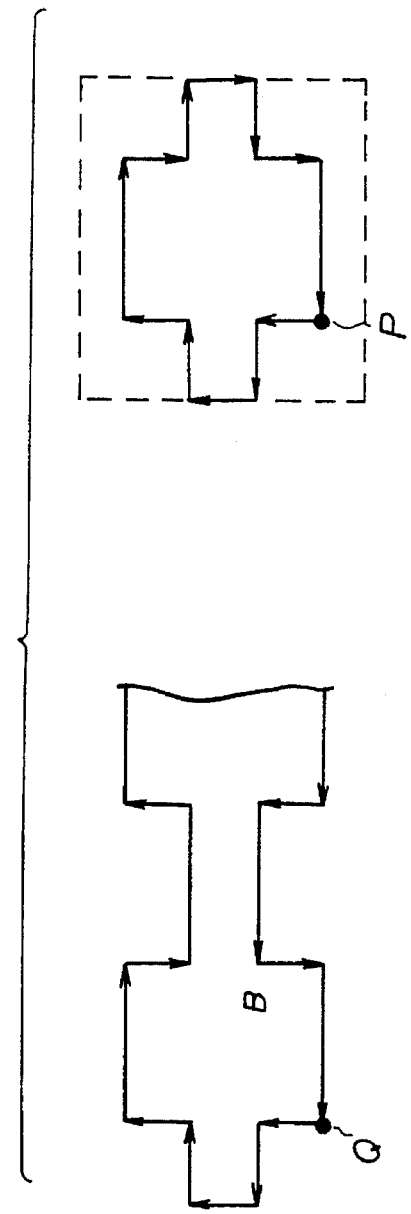

As shown in FIG. 19A, when an apex A of the input exposure pattern is detected at which the input vector is the same as the input vector at the corresponding apex of the unit block pattern while the output vector does not coincide with the output vector of the unit block pattern, the above apex A is defined as an incomplete matching point A. That is, only the input vectors match at the incomplete matching points A of the input pattern and the unit block pattern. As shown in FIG. 19B, when an apex B of the input exposure pattern is detected at which the output vector is the same as the output vector at the corresponding apex of the unit block pattern while the input vectors does not coincide with the input vector of the unit block pattern, the above apex B is defined as an incomplete matching point B. That is, only the output vectors match at the incomplete matching points B of the input pattern and the unit block pattern.

As shown in FIG. 20A, when the incomplete matching point A is detected, a remaining point Ra corresponding to the end point of the output vector extending from the incomplete point A of the input pattern is given information indicating a cutting point Ca at which the above output vector from the incomplete matching point A is cut by the boundary line of the unit block pattern. As shown in FIG. 20B, when the incomplete matching point B is detected, a remaining point Rb corresponding to the starting point of the input vector is given information indicating a cutting point Cb at which the above input vector terminating at the incomplete matching point B is cut by the boundary line of the unit block pattern. However, when the incomplete matching point A or B corresponds to the remaining point at which another block is cut, the above information concerning the cutting point Ca or Cb is not given to the remaining point A or B. The above information adding operation is performed by the decision unit 140 shown in FIG. 6.

Figure 21A:
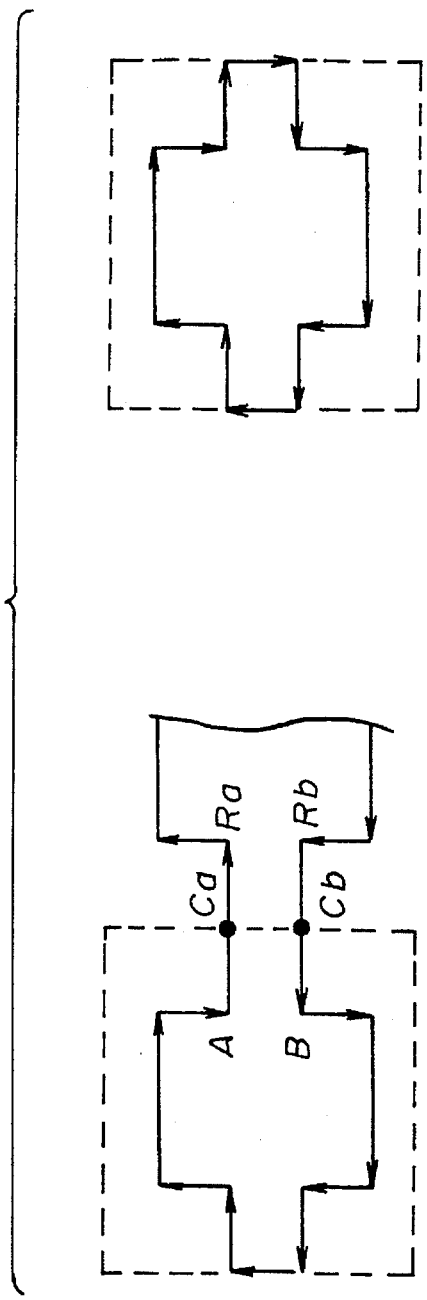
FIGS. 21A and 21B are diagrams showing how the unit block exposure pattern is extracted from the input pattern.
Figure 21B:
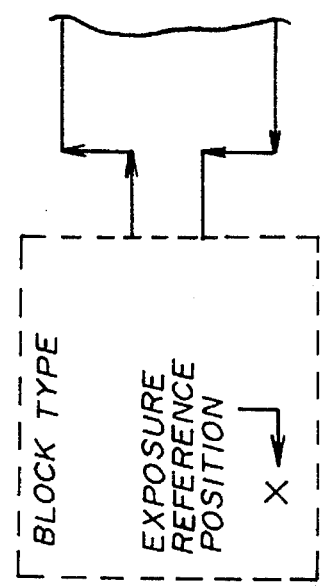

As shown in FIG. 21A, when the incomplete matching point A is detected in the process for sequentially comparing the input and output vectors of each of the apexes of the input patterns with the input and output vectors of each of the apexes of the unit block pattern, a decision as to whether or not the input and output vectors of the input patterns match those of the unit block pattern is not made for each point until the incomplete matching point B is detected in the clockwise searching process. Then, the cutting points Ca and Cb are obtained, and information indicating the identified unit block pattern and the reference point P is stored as data of the block exposure.

Figure 22A:
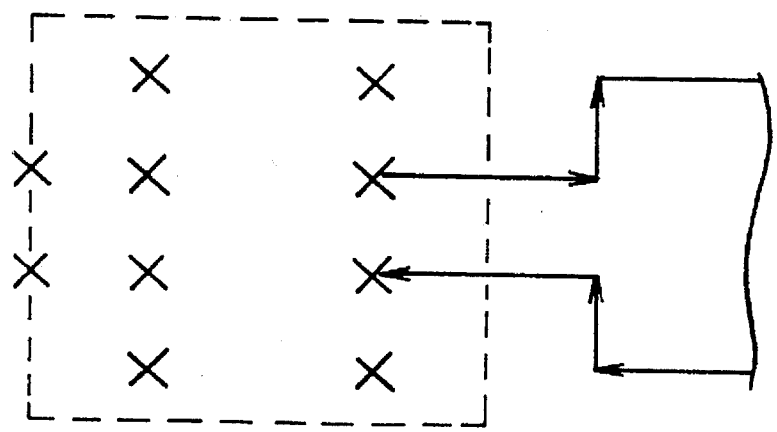
FIGS. 22A and 22B are diagrams illustrating a postprocessing peformed after block exposure pattern data is extracted.

Then, it is determined whether or not the apexes of the input pattern including the cutting points A and B match the apexes of the unit block pattern. When either the first decision result or the second decision result is obtained, as shown in FIG. 22A a pattern corresponding to the unit block pattern is extracted and data indicating the apexes thereof indicated by "X" in FIG. 22A is canceled (replaced by "0").

Figure 22B:
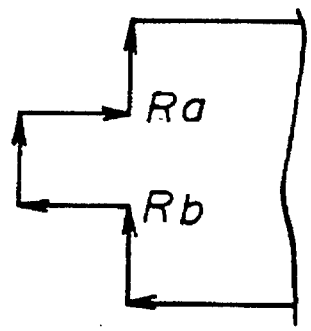

As shown in FIG. 22B, the remaining pattern from which the unit block pattern has been extracted is corrected on the basis of the information given to the remaining points Ra and Rb, if another unit block pattern cannot be extracted from the remaining pattern. The remaining pattern is exposed by the conventional variable rectangle-shaped beam.

According to the second embodiment of the present invention, it is possible to efficiently extract unit block patterns from a continuous pattern having unit block patterns continuously connected and to hence realize a high throughput in the mass production.

As has been described previously, a plurality of unit block patterns are prepared. In this case, it is possible to define searching priority between the unit block patterns or to give the highest priority to the unit block pattern immediately before extracted from the input pattern. It is also possible to use the combination of the two different priority definitions. It is also possible to simultaneously compare the input pattern with the unit block patterns in the following manner of a third embodiment of the present invention.

Figure 23:
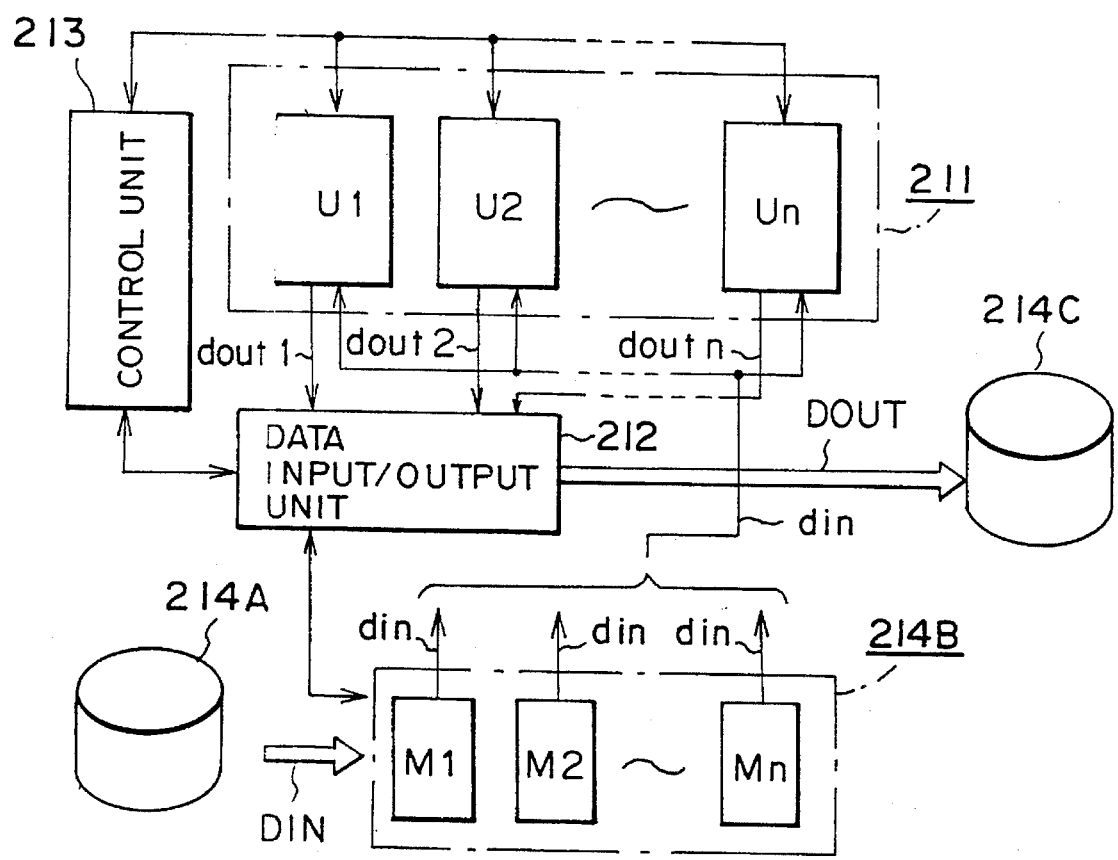
FIG. 23 is a block diagram of a block exposure pattern data extracting system according to a third embodiment of the present invention.
Figure 24:
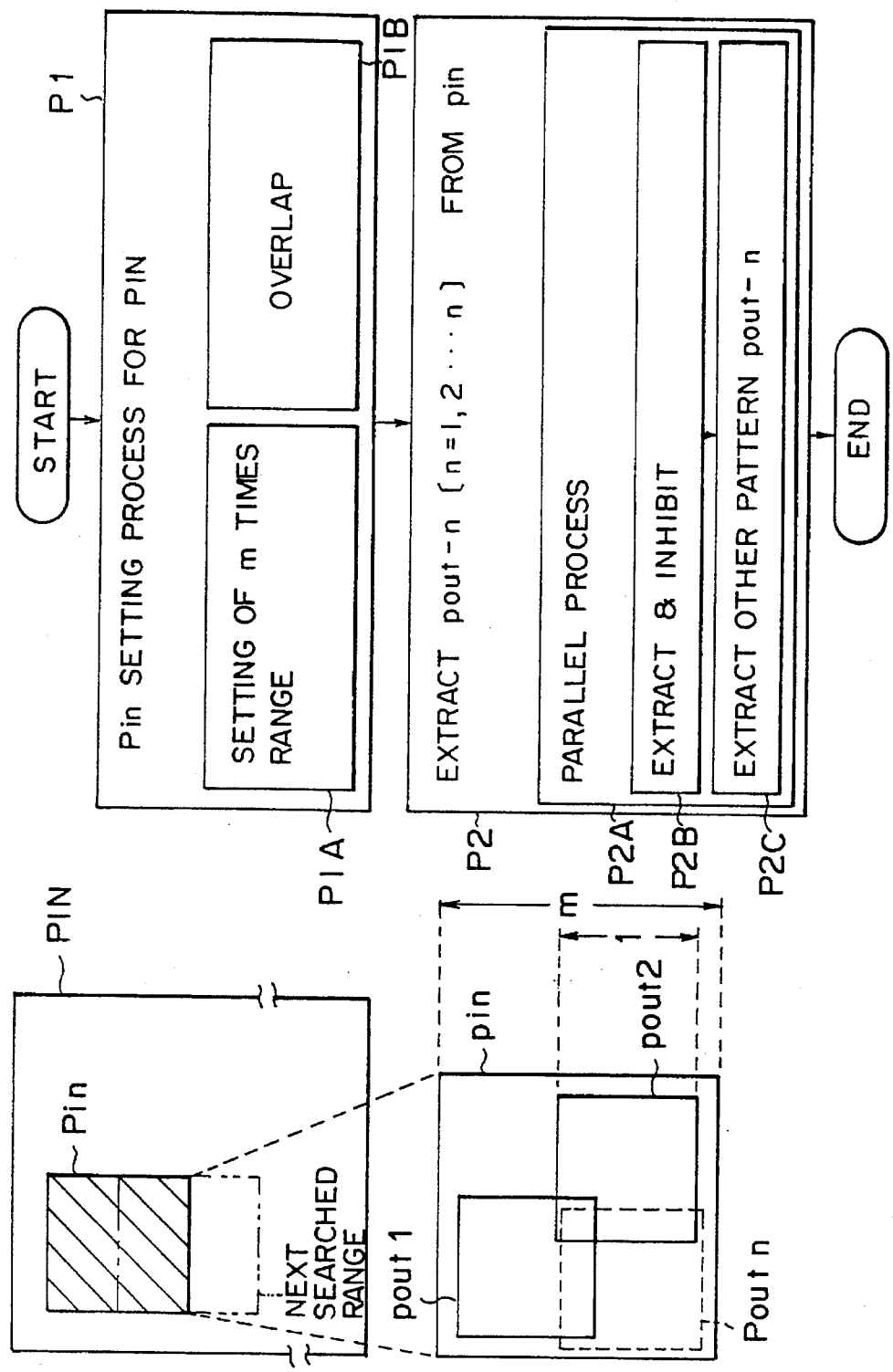
FIG. 24 is a diagram of a block exposure pattern data extracting process according to the third embodiment of the present invention.

FIG. 23 is a block diagram of an exposure block pattern data extracting system according to the third embodiment of the present invention. FIG. 24 shows the principle of a block pattern exposure data extracting process used in the third embodiment of the present invention.

Referring to FIG. 23, the system includes a block pattern exposure data extracting unit 211, a data input/output unit 212, a control unit 213, a first storage device 214A, a second storage device 214B and a third storage device 214C. The block pattern data extracting unit 211 extracts data indicating at least one unit block exposure pattern DOUT=dout-n [n=1, 2, . . . , n] from exposure data din to be searched, where n is an integer. More particularly, the extracting unit 211 is configured on the basis of the aforementioned first or second embodiment of the present invention. The data input/output unit 212 controls a data input/output operation on the exposure data din and the block exposure data DOUT. The control unit 213 controls the block exposure data extracting unit 211 and the data input/output unit 212. The block exposure data extracting unit 211 includes n data extraction processor units U1–Un respectively functioning to extract unit block patterns. The data input/output unit 212 selects exposure data din to be searched from among exposure data DIN stored in the first storage device 214A.

The second storage device 214B has n storage units M1–Mn used to store the selected exposure data read from the first storage device 214A. That is, the n storage units M1–Mn are respectively provided for the n processor units U1–Un respectively corresponding to predetermined n unit block patterns. The processor units U1–Un read the selected exposure data din frown the respective memory units M1–Mn, and compare the selected exposure data din with data indicating the n respective unit block patterns stored in the processor units U1–Un. In this manner, the selected exposure data din is simultaneously compared with the n unit block patterns by the processor units U1–Un.

When one of the processor units U1–Un detects a match between its own block pattern and the pattern indicated by the selected exposure data din, the processor unit which detects the match outputs a read enable signal to the control unit 213. If the read enable signal is output by the processor unit U1, the control unit 213 inhibits the exposure data corresponding to the identified unit block pattern from being used to detect other unit block patterns. In this manner, data on the identified unit block pattern is extracted from the selected exposure data din, and is output to the data input/output unit 212. The remaining data of the exposure data din other than the extracted unit block pattern data is corrected so that the data indicating the identified unit block pattern is included in the exposure data instead of the original data.

In the above-mentioned manner, block exposure data Dour which may be output by the processor units U1–Un are passed to the third storage device 214C via the data input/output unit 212.

Referring to FIG. 24, the data input/output unit 212 specifies a searched exposure pattern Pin in exposure pattern PIN to be searched in step P1. In FIG. 24, the searched exposure pattern Pin is indicated as a hatched area. In step P1A, the data input/output unit 212 specifies, as the searched exposure pattern Pin, a square area having a length (side) equal to m times that of the unit block pattern pout-n where m is equal to or greater than 2. Further, in step P1B, the next searching area Pin is selected so that it partially overlaps the current searching area, as shown in FIG. 24. The steps P1A and P1B enable unit block patterns to be accurately extracted from the exposure pattern PIN. For example, a unit block pattern within two adjacent exposure pattern areas can be accurately identified.

In step P2, the extracting unit 211 performs a process for extracting one or more unit block patterns POUT=pout-n [n=1, 2, i, j, . . . , n] from the exposure pattern area Pin. More particularly, in step P2A, the searched exposure pattern Pin is simultaneously compared with the unit block patterns by means of the processor units U1–Un. In step P2B, when one of the unit block patterns corresponding to the searched exposure pattern Pin is identified, the corresponding area within which the searched exposure pattern area Pin exists, is specified as a read inhibited area. Hence, the exposure data within the read inhibit area is inhibited from being used to detect other unit block patterns. In step P2C, a process for extracting other patterns corresponding to the unit, block patterns from the searched exposure pattern Pin is carried out. That is, in step P2C, the remaining exposure data within the searching area is compared with all the unit block exposure patterns.

More particularly, when the unit block pattern pout-i is identified within the searched exposure pattern Pin, the corresponding processor unit Ui informs the control unit 213 of information indicating the area within the identified unit block pattern pout-i. Then, the control unit 213 informs the other processor units U1–Ui–1 and Ui+1–Un that the exposure data of the identified unit block pattern pout-i is no longer used. Hence, it is not necessary to compare all the exposure data within the searched area with data of all the unit block patterns.

A further description of the third embodiment of the present invention will now be given.

Figure 25:
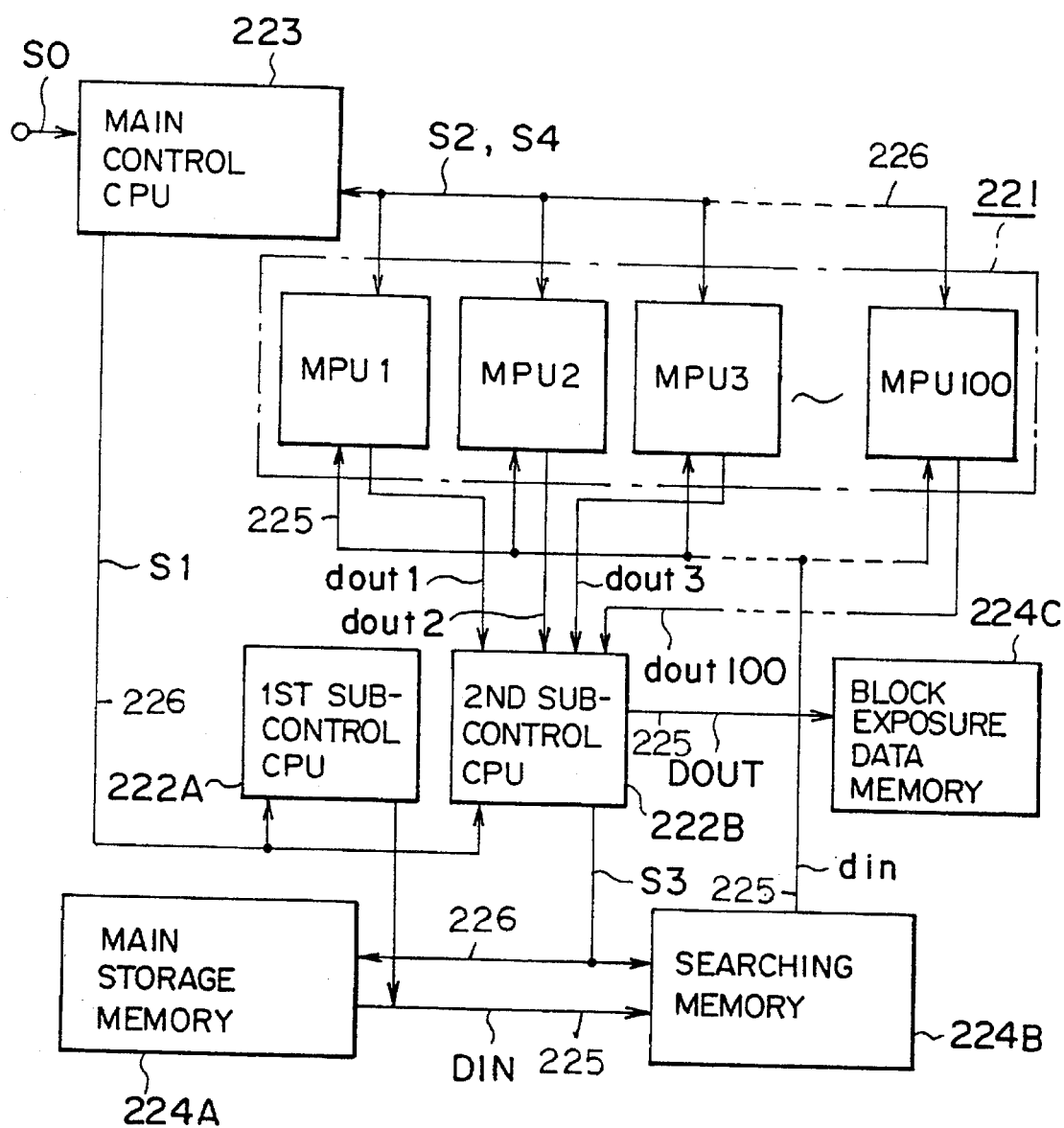
FIG. 25 is a block diagram of the block exposure pattern data extracting system according to the third embodiment of the present invention.

FIG. 25 is a block diagram of a block exposure pattern data extracting system according to the third embodiment of the present invention. The structure shown in FIG. 25 corresponds to a structure obtained by depicting the structure shown in FIG. 23 in more detail.

The system shown in FIG. 25 includes an array 221 of block extraction processors (microprocessors) MPU1–MPU100 connected to data buses 225, and control lines 226. Further, the system includes a first sub-control CPU 222A and a second sub-control CPU 222B, a main control CPU 223, a main storage device 224A, a search memory 224B and a block exposure data memory 224C.

The array 221 of block extraction processors MPU1–MPU100 corresponds to the block exposure data extracting unit 211 shown in FIG. 23. The block extraction processors MPU1–MPU100 [n=100] receive searched exposure data din from the search memory 224B, and compare the searched exposure data with data indicating respective unit block patterns. In the structure shown in FIG. 25, 100 unit block patterns can be handled by 100 processors MPU1–MPU100.

The first sub-control CPU 222A corresponds to a part of the data input/output unit 212 shown in FIG. 23. More particularly, the first sub-control CPU 222A reads exposure data DIN from the main storage device 224A and transfers the read exposure data DIN to the search memory 224B in response to a sub-control signal S1 and a memory control signal S3.

The second sub-control CPU 222B corresponds to the remaining part of the data input/output unit 212. More particularly, the second sub-control CPU 222B specifies searched exposure data din contained in the exposure data DIN in response to the sub-control signal S1. Further, in response to the memory control signal S3, the CPU 222B reads the searched exposure data din from the search memory 224B and transfers the searched exposure data din to the extracting processors MPU1–MPU100. Furthermore, the CPU 222B performs a data transfer operation in which unit block exposure data pieces dout-1–dout-100 are transferred to the block exposure data memory 224C as block exposure data DOUT. Moreover, the CPU 222B functions to select one or more unit block exposure data pieces dout-n and to correct (rearrange) the remaining data of the searched exposure data din. For example, data "0" is substituted for exposure data of the searched exposure data dill which is identified as block exposure data indicating a unit block pattern.

The main control CPU 223 corresponds to the control unit 213 shown in FIG. 23, and controls the array 221, and the first and second sub-control CPUs 222A and 222B. For example, the main control CPU 223 outputs a processor control signal S2 to the extracting processors MPU1–MPU100 and outputs the sub-control signal S1 to the first and second sub-control CPUs 222A and 222B. Further, the main control CPU 223 receives read enable signals S4 from the extracting processors MPU1–MPU100, which generate the respective read enable signals S4 when the corresponding unit block patterns are identified. Furthermore, in response to the read enable signal S4 from one of the extracting processors MPU1–MPU100, the CPU 223 outputs the aforementioned processor control signal S2 which indicates that exposure data determined as exposure data indicating one of the unit block patterns cannot be used to detect other unit block patterns to the extracting processors MPU1–MPU100 except for the extracting processor which detects the unit block pattern.

The main storage device 224A corresponds to the first storage device 214A shown in FIG. 23, and the search memory 224B corresponds to the second storage device 214B shown in FIG. 23. Further, the block exposure data memory 224C corresponds to the third storage device 214C shown in FIG. 23.

Figure 26:
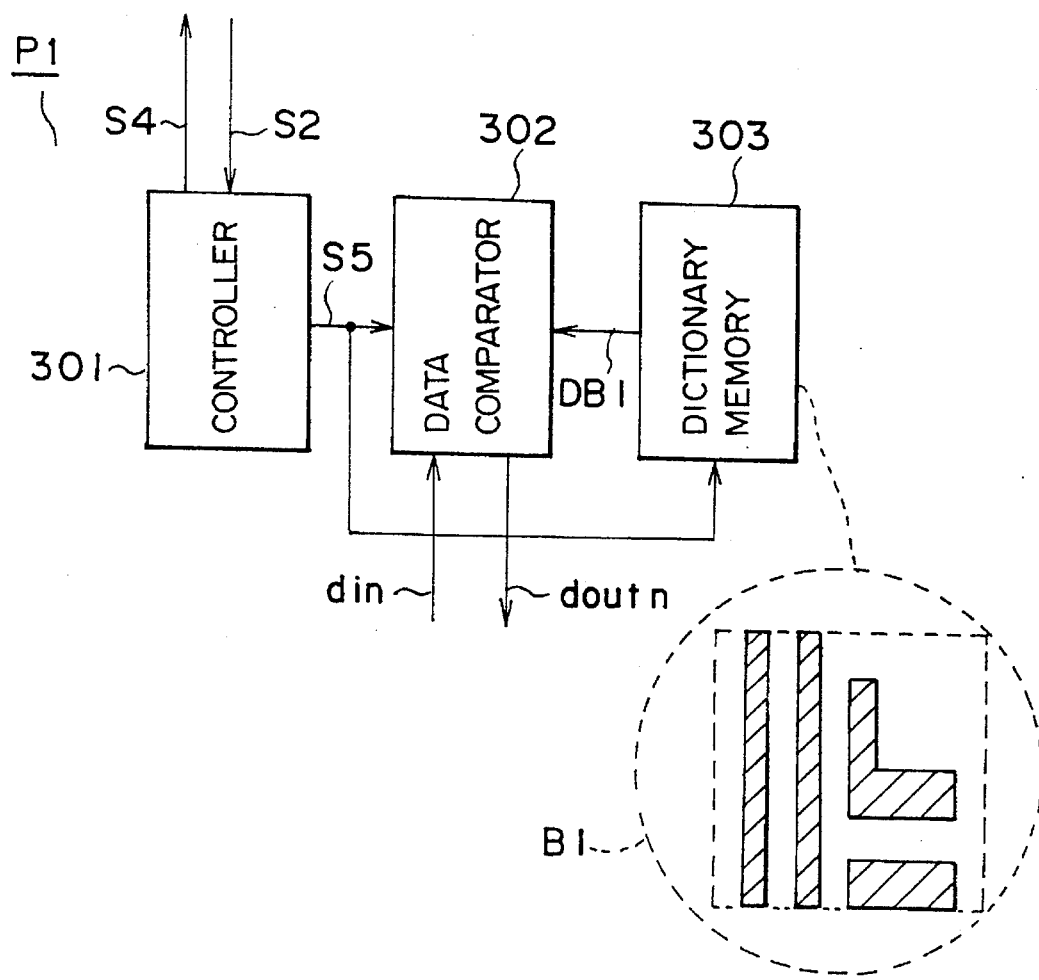
FIG. 26 is a block diagram of each extracting processor shown in FIG. 25.

FIG. 26 is a block diagram of each of the extracting processors MPU1–MPU100. Each of the extracting processors XPU1–XPU100 corresponds to one of the 100 unit block patterns corresponding to one of 100 slits of the block mask of the electron beam exposure system. It will now be assumed that FIG. 26 shows the structure of the extracting processor MPU1 which detects a unit block pattern B1. The extracting processor MPU1 includes a controller 301, a data comparator 302 and a dictionary memory 303.

The controller 301 causes searched exposure data din to be input to the data comparator 302 in response to the processor control signal S2, and outputs the read enable signal S4 to the main control CPU 223. The dictionary memory 303 stores block pattern data indicating the unit block pattern B1 shown in FIG. 26. The data comparator 302 receives an input/output control signal S5 from the controller 301, and sets a searching window to the searched exposure data din. Then, the data comparator 302 compares exposure data within the searching window with dictionary pattern data DB1 corresponding to the data of the unit block pattern B1.

Figures 27A, 27B, 27C:
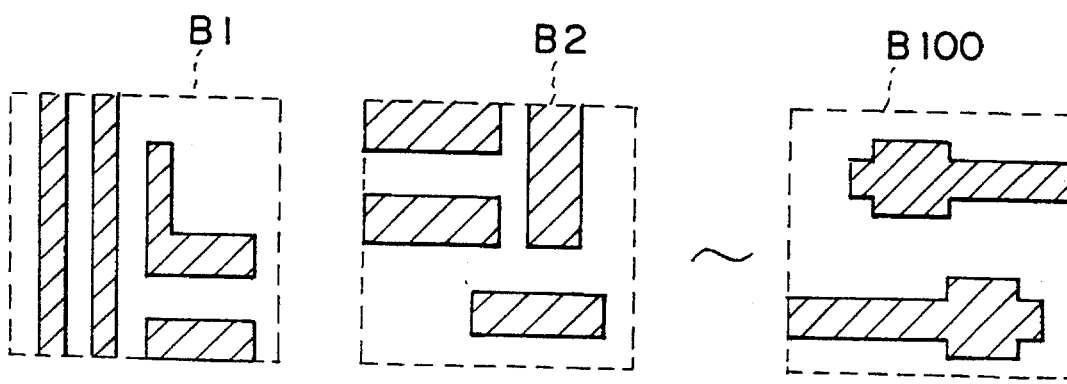
FIGS. 27A, 27B and 27C are diagrams of unit block exposure patterns.

If the unit block pattern B1 is contained in a searched exposure pattern pin of the searched exposure data, the extracting processor MPU1 detects a match between the searched exposure pattern pin and the unit block pattern B1, and outputs the read enable signal S4 to the main processor CPU 223. The dictionary memory 303 stores the dictionary pattern data DB1 indicating the unit block pattern B1. The dictionary pattern data DB1 is read from the dictionary memory 303 in response to the input/output control signal S5 output by the controller 301. The dictionary memories 303 of the extracting processors MPU2–MPU100 store data indicating unit block patterns B2–B100 different from each other and different from the unit block pattern B1, as shown in FIG. 27A, 27B and 27C.

In operation, the exposure data DIN read from the main storage device 224A is passed to the first sub-control CPU 222A, which specifies searched exposure data din contained in the read exposure data DIN under the control of the main control CPU 223. The specified searched exposure data din is temporarily stored in the search memory 224B. Then, the searched exposure data din is passed to the extracting processors MPU1–MPU100, which compare the searched exposure data din with data indicating the respective unit block patterns. The extracting processors MPU1–MPU100 simultaneously operate and determine whether or not the searched exposure data din coincides with data of the respective unit block patterns. For example, when it is determined that the unit block pattern B1 is contained in the searched exposure data din, the extracting processor MPU1 outputs the read enable signal S4 to the main control CPU 223. Further, unit block pattern data dout-1 corresponding to the unit block pattern B1 is output to the second sub-control CPU 222B, which transfers the received unit block pattern data dout-1 to the block exposure data memory 224C.

The remaining part of the searched exposure data din other than the unit block pattern data dout-1 is corrected in the aforementioned manner. Block exposure data dout-2 to dout-n output by the processors MPU2–MPU100 are output to the second sub-control CPU 222B, which transfers the received block exposure data to the block exposure data memory 224C.

A further description will now be given, with reference to FIG. 28, of the block exposure pattern extracting process of the third embodiment of the present invention. In step P101, an input process for inputting the exposure data DIN to the system is carried out. In this step, the exposure data DIN is loaded from the main storage memory 224A to the search memory 224B in accordance with the sub-control signal S1 and the memory control signal S3 under the control of the first sub-control CPU 222A.

In step P102, a searching range (area) specifying operation on the exposure pattern PIN is performed, so that searched exposure pattern pin is specified.

Figure 29A:
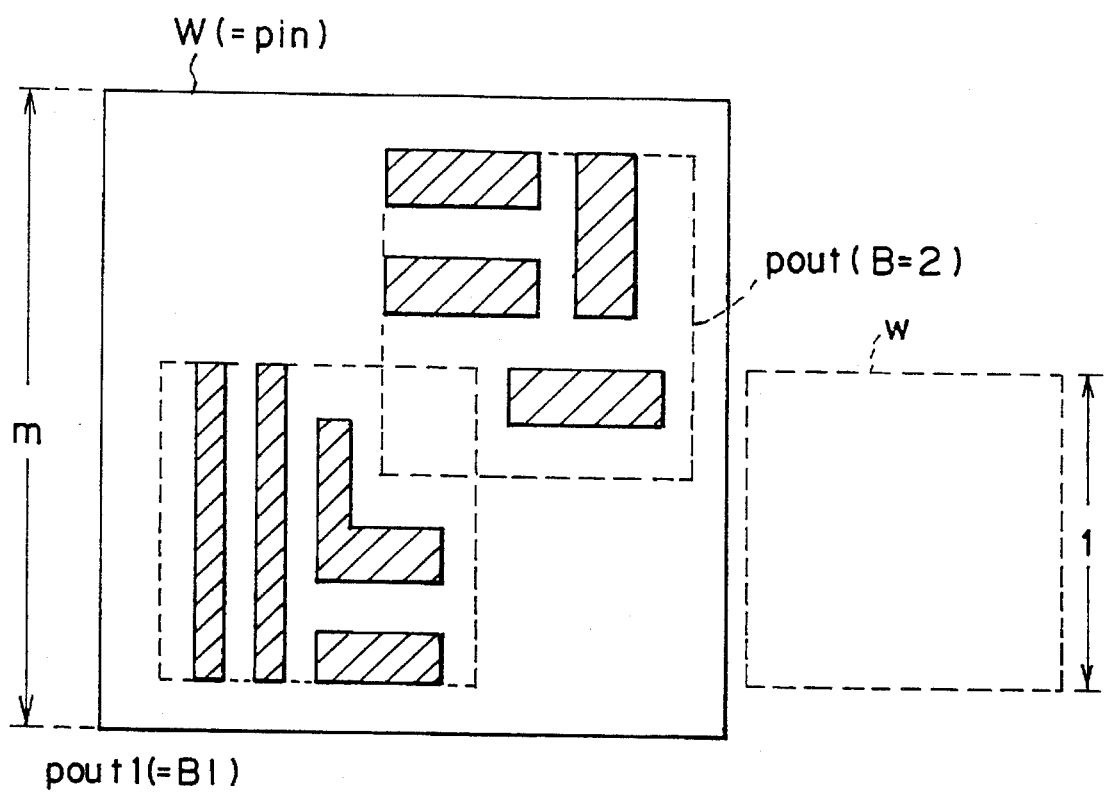
FIGS. 29A and 29B are diagrams of a searched memory area.

As shown in FIG. 29A, a searching range (which is also referred to as a searched memory range) is selected so as to have a side equal to or longer than m times the side of a unit block exposure pattern area W. For example, a searching area (range) may be having an area equal to four times that of a unit block pattern. In other words, a searching area having a length and a breath respectively equal to twice (m=2) those of the unit block pattern may be selected. Further, in step P102, a new searched memory area W is selected so that it partially overlaps the previously selected searched memory areas 1–5 shown in FIG. 30A.

The searched exposure data din contained in the exposure data DIN is specified by the second sub-control CPU 222B in response to the sub-control signal S1. The searched exposure data din is read from the search memory 224B in response to the memory control signal S3, and is then transferred to the extracting processors MPU1–MPU100.

In steps P103–P105, steps P106–P108 and steps P109–P111, the searched exposure data din is compared with the 100 unit exposure patterns POUT=pout-1–pout-100 in parallel form. More particularly, steps P103–P105 relate to a process for extracting the unit block pattern B1 from the searched exposure pattern pin. The data comparator 302 is supplied with the searched exposure data din in response to the processor control signal S2. Further, the data comparator 302 is supplied with the dictionary pattern data DB1 which corresponds to the block pattern B1 of the extracting processor MPU1 and which is read from the dictionary memory 303 in the processor control signal S2 applied to the controller 301.

In response to the input/output control signal S5 from the controller 301 shown in FIG. 26, the data comparator 302 sets the searching window to the searched exposure data dill, and compares the dictionary pattern data DB1 with exposure data obtained via the searching window.

In step P104, it is determined whether or not the unit block pattern B1 can be extracted from the exposure data within the searching window. When the result of step P104 is YES, step P105 is carried out. When the result of step P104 is NO, step P103 is carried out.

When it is determined that a unit block pattern pout-1 can be extracted from the searched exposure pattern pin, the extracting processor MPU1 outputs the read enable signal S4 to the main control CPU 233 and outputs the unit block exposure data dout-1 to the second sub-control CPU 222B. It will be noted that the decision made in step P104 is based on the aforementioned process of the first embodiment of the present invention.

Figure 29B:
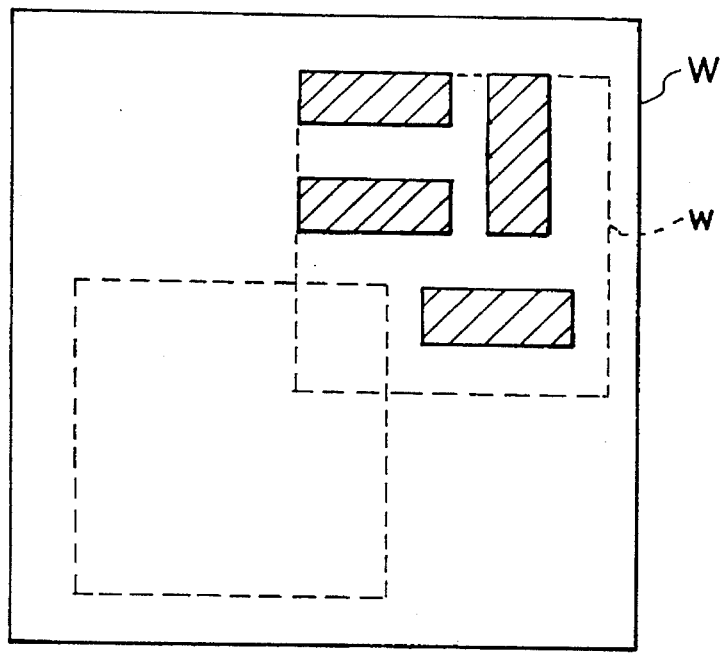

When the result of step P104 is YES, the second sub-control CPU 222B performs an extracting process for extracting the unit block exposure pattern pout-1 (B1) from the searched exposure pattern pin. Referring to FIG. 29B, the extracting process performed by the second sub-control CPU 222B replaces the original exposure data which is determined as the unit block pattern data by exposure data "0". More particularly, the second sub-control CPU 222B replaces part of the exposure data DIN extracted from among the searched exposure data din by exposure data "0". Further, the second sub-control CPU 222B receives the read enable signal S4 from the extracting processor MPU1, and supplies the extracting processors MPU2–MPU100 with the processor control signal S2 indicating that the exposure data in the area from which the unit block exposure data dour-1 is extracted is inhibited from being used.

The block exposure data DOUT=dout-1 is transferred from the array 212 to the block exposure data memory 224C under the control of the second sub-control CPU 222B, and is stored therein.

In the same manner as described above, steps P106–P108 extract the unit block pattern B2. More particularly, the process for extracting the unit block pattern B2 from the searched exposure pattern pin is carried out in step P106. In step P107, it is determined whether or not the unit block pattern B2 is present in the searched exposure pattern pin. When the result of step P107 is YES, the unit block exposure pattern pout-2 is extracted from the searched exposure pattern pin in step P108. When it is determined, in step P107, that the unit block pattern B2 cannot be extracted from the searched exposure pattern pin, step P106 is performed.

In the same manner as described above, steps P109–P111 are carried out in order to extract the unit block pattern B100 from the searched exposure pattern pin. More particularly, the process for extracting the unit block pattern B100 from the searched exposure pattern pin is carried out in step P109. In step P110, it is determined whether or not the unit block pattern B100 is present in the searched exposure pattern pin. When the result of step P110 is YES, the unit block exposure pattern pout-100 is extracted from the searched exposure pattern pin in step P111. When it is determined, in step P110, that the unit block pattern B100 cannot be extracted from the searched exposure pattern pin, step P109 is performed.

The other unit block patterns are processed in the same manner as described above. In step P112, it is determined whether or not the entire searched area W has been processed. When the result of step P112 is YES, step P113 is carried out. When the result of step P112 is NO, steps P103, 106 and 109 are carried out. Then, the process for extracting one or more unit block patterns from the remaining pattern portion within the searched area W is carried out.

Figure 30A:
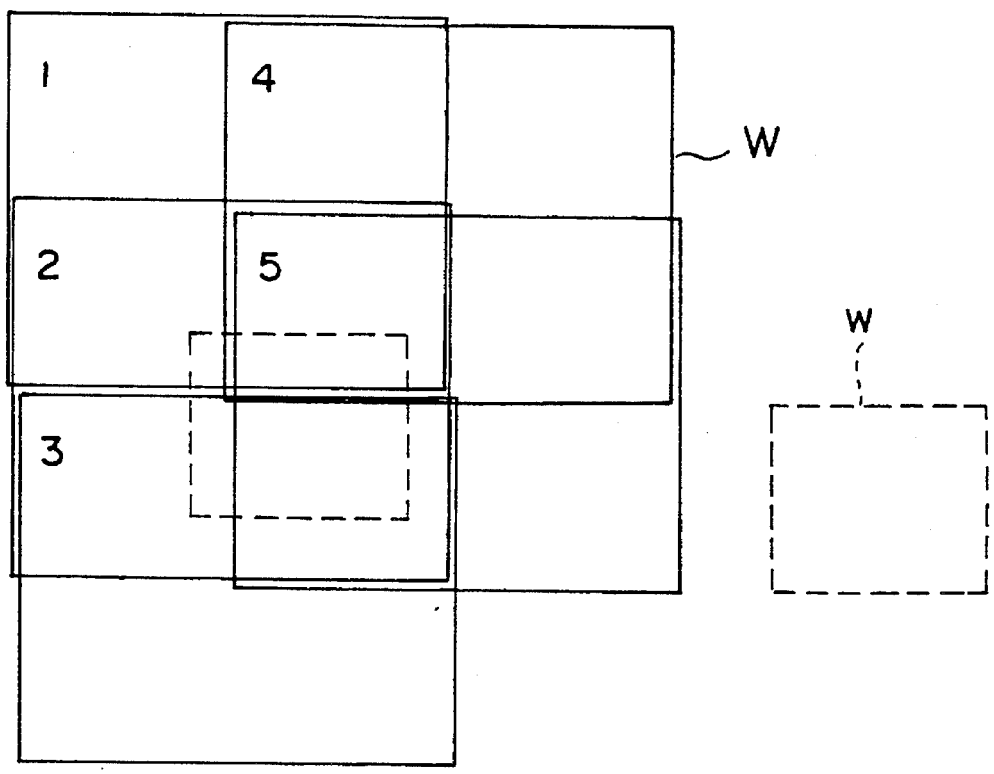
FIGS. 30A and 30B are diagrams illustrating how a searched memory area is specified.
Figure 30B:
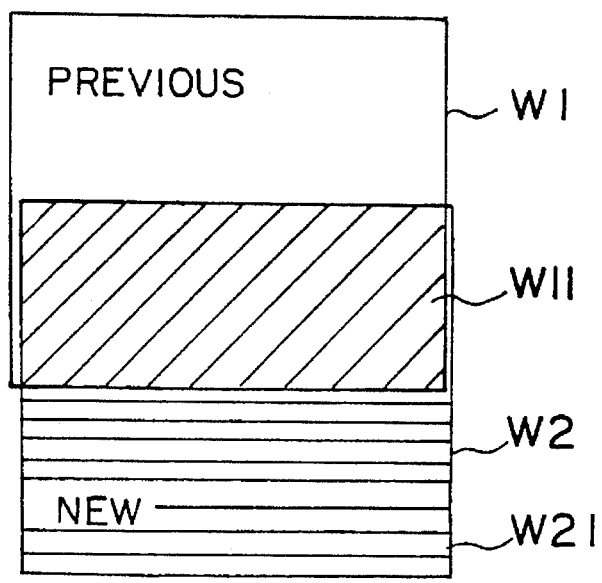

In step P113, it is determined whether or not the extracting process for all the exposure data DIN has been completed. When the result of step P113 is NO, the searching area setting process is carried out in step P101. As shown in FIG. 30B, exposure data in an overlapping portion W11 of the previous searching area W1 is left in the searching memory 224B, and only exposure data in a non-overlapping portion W21 of a new searching area W2 other than the overlapping portion W11 is loaded from the main storage device 224A to the searching memory 224B. By using a shift register, the searched exposure data din in the overlapping portion W11 can be shifted so that the searched exposure data din is scrolled. Hence, as shown in FIG. 30A, it is possible to correctly extract one or more unit block patterns from a pattern within an overlapping area in which the searched areas W1–W5 partially overlap.

Figure 28:
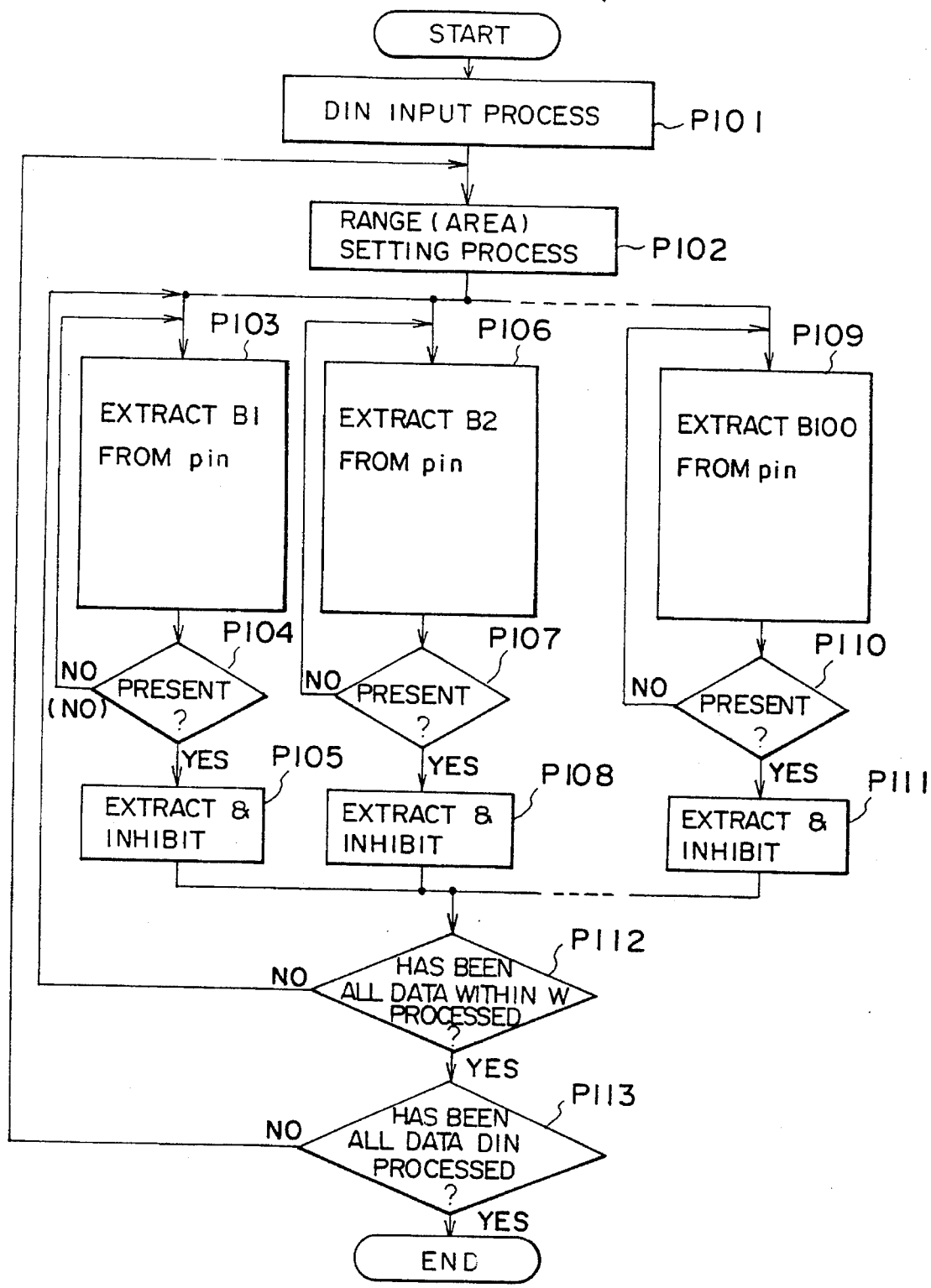
FIG. 28 is a flowchart of the block exposure pattern data extracting process according to the third embodiment of the present invention.

When the result of step P113 is YES, the process shown in FIG. 28 ends.

Figure 31:
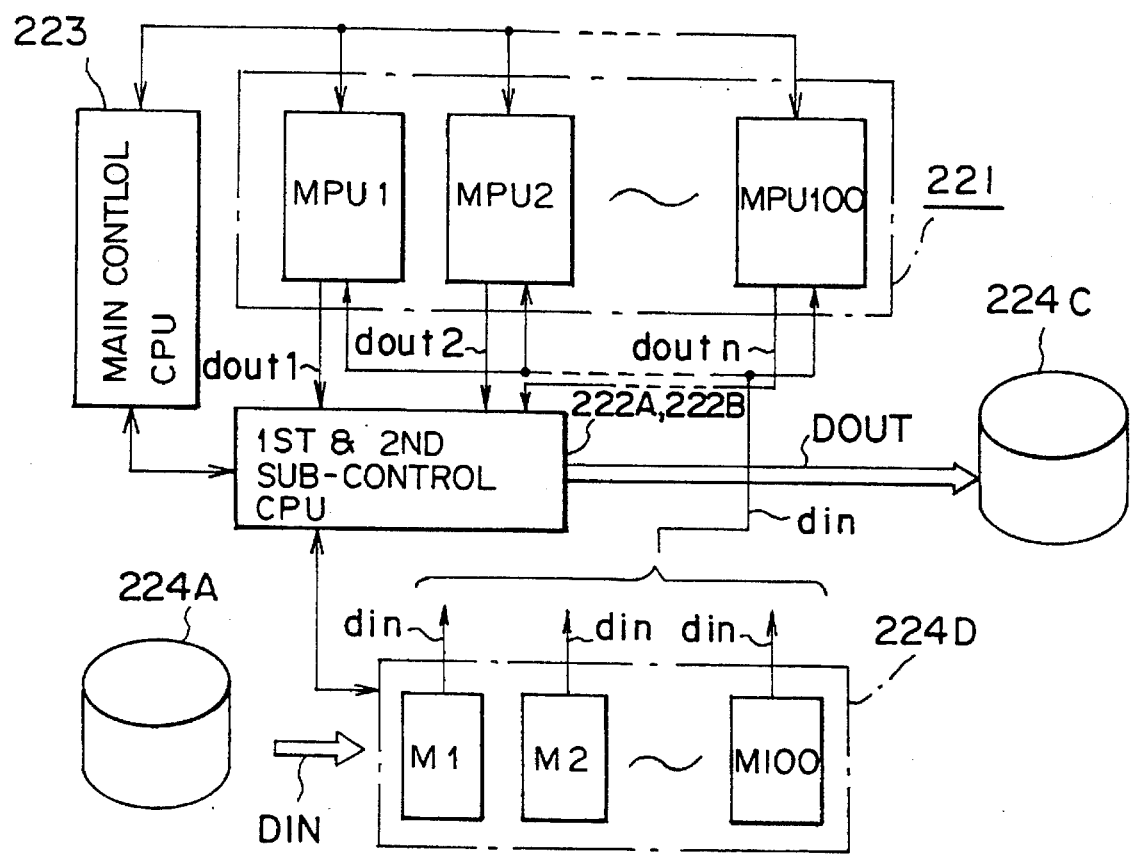
FIG. 31 is a block diagram of a block exposure pattern data extracting system according to an additional embodiment of the present invention.

FIG. 31 is a block diagram of a block exposure pattern data extracting system according to an additional embodiment of the present invention. This embodiment of the present invention differs from the third embodiment in that a searching memory array 224D is used instead of the searching memory 224B shown in FIG. 25. The searching memory array 224D includes 100 searching memories M1–M100 respectively associated with the extracting processors MPU1–MPU100. In this regard, the system structure shown in FIG. 31 is almost the same as that shown in FIG. 23.

By using the searching memory array 224D, the extracting processors MPU1–MPU100 can independently use the memories M1–M100. Hence, it is possible to effectively perform the correction operation on the searched exposure data din after a unit block exposure pattern is extracted by means of the second sub-control CPU 222B and the data transfer operation in which block exposure pattern data is transferred to the block exposure data memory 224C.

The present invention is not limited to the specifically disclosed embodiments, and variations and modifications may be made without departing from the scope of the present invention.

What is claimed is:

1. A pattern extracting apparatus which is applied to a charge-particle beam exposure system for extracting an input exposure pattern corresponding to a unit block exposure pattern, the input exposure pattern including a plurality of apexes, a selected apex of the input exposure pattern having first vectors connecting the selected apex to other apexes of the input exposure pattern, the unit block exposure pattern including a plurality of apexes, one of the plurality of apexes of the unit block exposure pattern being a reference point having second vectors connecting the reference point to other apexes of the unit block exposure pattern, said pattern extracting apparatus comprising:

comparator means for comparing the first vectors of the selected apex of the input exposure pattern with the second vectors of the reference point of the unit block exposure pattern;

determining means, coupled to said comparator means, for determining whether or not the first vectors coincide with the second vectors; and extracting means, coupled to the determining means, for extracting the input exposure pattern as the unit block exposure pattern when the determining means determines that the first vectors coincide with the second vectors.

2. The pattern extracting apparatus as claimed in claim 1, wherein each apex of the input exposure pattern has first and second adjacent apexes and a corresponding input vector which connects the apex to the first adjacent apex and a corresponding output vector which connects the apex to the second adjacent apex, the corresponding input vector and corresponding output vector of each apex being a set of input/output vectors corresponding to the apex, and the reference point of the unit block exposure pattern has first and second adjacent apexes and a corresponding input vector which connects the reference point to the first adjacent apex and a corresponding output vector which connects the reference point to the second adjacent apex, the corresponding input vector and the corresponding output vector of the reference point being a set of input/output vectors corresponding to the reference point, said pattern extracting apparatus further comprising:

first means for comparing a plurality of sets of input/output vectors corresponding to apexes of the input exposure pattern to the set of input/output vectors corresponding to the reference point of the unit block exposure pattern; and second means for determining whether the input exposure pattern coincides with the unit block exposure pattern, the second means determining that the input exposure pattern does not coincide with the unit block exposure pattern when none of the sets of input/output vectors corresponding to apexes of the input exposure pattern coincide with the set of input/output vectors corresponding to the reference point of the unit block exposure pattern.

3. The pattern extracting apparatus as claimed in claim 2, further comprising a means for activating the determining means when said second means determines that one of the sets of input/output vectors corresponding to an apex of the input exposure pattern coincides with the set of input/output vectors corresponding to the reference point of the unit block exposure pattern.

4. The pattern extracting system as claimed in claim 2, wherein an angle between the input vector corresponding to the reference point and the output vector corresponding to the reference point is greater than 90°.

5. The pattern extracting apparatus as claimed in claim 2, further comprising means for selecting a different set of input/output vectors for comparison by the first means when a set of input/output vectors compared by the first means and corresponding to a respective apex of the input exposure pattern does not coincide with the set of input/output vectors corresponding to the reference point of the unit block exposure pattern.

6. The pattern extracting apparatus as claimed in claim 2, wherein said determining means comprises:

first means for determining whether or not positions of the apexes of the input exposure pattern with respect to an arbitrary apex of the input exposure pattern coincide with positions of the apexes of the unit block exposure pattern with respect to the reference point; and second means for replacing a first selected apex of the input exposure pattern for comparison of first vectors by the comparator means with a second selected apex for comparison of first vectors by the comparator means when the input vector of the first selected apex does not match the input vector of a corresponding apex of the unit block exposure pattern, and also when the output vector of the first selected apex does not match the output vector of the corresponding apex of the unit block exposure pattern.

7. The pattern extracting apparatus as claimed in claim 6, wherein the first selected apex is an end point of an input vector from an adjacent apex of the first selected apex and a starting point of an output vector from a different adjacent apex of the first selected apex.

8. The pattern extracting apparatus as claimed in claim 7, wherein one of the following conditions is satisfied:

the output vector of the first selected apex is the input vector of the second selected apex, and the input vector of the first selected apex is the output vector of the second selected apex.

9. The pattern extracting apparatus as claimed in claim 6, further comprising vector generating means for generating a vector connecting the first selected apex and the second selected apex, the vector having a termination point at which the vector is terminated to enable the input exposure pattern to approximate the unit block exposure pattern.

10. The pattern extracting apparatus as claimed in claim 1, wherein said determining means comprises:

first means for determining whether or not positions of the apexes of the input exposure pattern with respect to an arbitrary apex of the input exposure pattern coincide with positions of the apexes of the unit block exposure pattern with respect to the reference point; and second means for determining whether or not the number of the apexes of the input exposure pattern is equal to the number of apexes of the unit block exposure pattern.

11. The pattern extracting apparatus as claimed in claim 1, further comprising specifying means for specifying a searching area which is a part of an input pattern indicated by input exposure data, and for outputting exposure data in said searching area as said input exposure pattern.

12. The pattern extracting apparatus as claimed in claim 11, further comprising means for causing said specifying means to specify a next searching area which partially overlaps a current searching area.

13. The pattern extracting apparatus as claimed in claim 11, wherein the searching area has a size greater than the size of the unit block pattern.

14. The pattern extracting apparatus as claimed in claim 1, wherein each apex of the input exposure pattern and each apex of the unit block exposure pattern has first and second adjacent apexes and a corresponding input vector which connects the apex to the first adjacent apex and a corresponding output vector which connects the apex to the second adjacent apex, the corresponding input vector and corresponding output vector of each apex being a set of input/output vectors corresponding to the apex, said determining means comprises:

first means for determining whether or not positions of the apexes of the input exposure pattern with respect to an arbitrary apex of the input exposure pattern coincide with positions of the apexes of the unit block exposure pattern with respect to the reference point; and second means for determining whether or not a plurality of sets of input/output vectors corresponding to apexes of the input exposure pattern coincide with a plurality of sets of input/output vectors corresponding to apexes of the unit block exposure pattern.

15. A pattern extracting apparatus which is applied to a charged particle beam exposure system for extracting an input exposure pattern corresponding to a unit block pattern, the input exposure pattern including a plurality of apexes, a selected apex of the input exposure pattern having first vectors connecting the selected apex to other apexes of the input exposure pattern, the unit block exposure pattern including a plurality of apexes, one of the plurality of apexes of the unit block exposure pattern being a reference point having second vectors connecting the reference point to other apexes of the unit block exposure pattern, said pattern extracting apparatus comprising:

comparator means for comparing, for each unit block exposure pattern of a plurality of unit block exposure patterns, the first vectors of the selected apex of the input exposure pattern with the second vectors of the reference point of the unit block exposure pattern;

determining means, coupled to said comparator means, for determining, for each unit block exposure pattern of which the comparator compares first vectors, whether or not the first vectors of the input exposure pattern coincide with the second vectors of the unit block exposure pattern; and extracting means, coupled to the determining means, for extracting the input exposure pattern as a respective unit block exposure pattern of the plurality of unit block exposure patterns when the determining means determines that the first vectors of the input exposure pattern coincide with the second vectors of the respective unit block exposure pattern of the plurality of unit block exposure patterns.

16. The pattern extracting apparatus as claimed in claim 15, wherein said comparator means comprises a plurality of comparators respectively provided for the plurality of unit block exposure patterns.

17. The pattern extracting apparatus as claimed in claim 15, further comprising a plurality of memories respectively provided for the plurality of unit block exposure patterns, the plurality of memories storing exposure data indicating the input exposure pattern, wherein said comparator means comprises means for simultaneously accessing the plurality of memories.

18. The pattern extracting apparatus as claimed in claim 15, wherein an input exposure pattern extracted by the extracting means is formed by corresponding exposure data and the pattern extracting apparatus further comprises replacing means for replacing the exposure data.

19. The pattern extracting apparatus as claimed in claim 15, further comprising memory means for storing exposure data indicating the input exposure pattern, wherein said comparator means comprises means for accessing said memory means.

20. The pattern extracting apparatus as claimed in claim 15, wherein:

said determining means comprises a plurality of processors provided for, and respectively corresponding to, the plurality of unit block exposure patterns, each processor of the plurality of processors determining whether or not the first vectors of the input exposure pattern coincide with the second vectors of the corresponding unit block exposure pattern.

21. The pattern extracting apparatus as claimed in claim 20, further comprising:

control means for preventing, when a first processor of the plurality of processors determines that the first vectors of the input exposure pattern coincide with the second vectors of the reference point of the corresponding unit block exposure pattern, the remaining processors of the plurality of processors from using exposure data from an area of which the unit block exposure pattern corresponding to the first processor is extracted.

22. A pattern extracting method which is applied to a charged-particle beam exposure system for extracting an input exposure pattern corresponding to a unit block exposure pattern, the input exposure pattern including a plurality of apexes, a selected apex of the input exposure pattern having first vectors connecting the selected apex to other apexes of the input exposure pattern, the unit block exposure pattern including a plurality of apexes, one of the plurality of apexes of the unit block exposure pattern being a reference point having second vectors connecting the reference point to other apexes of the unit block exposure pattern, said pattern extracting method comprising:

comparing the first vectors of the selected apex of the input exposure pattern with the second vectors of the reference point of the unit block exposure pattern;

determining whether or not the first vectors coincide with the second vectors; and extracting the input exposure pattern as the unit block exposure pattern when the determining step determines that the first vectors coincide with the second vectors.

23. The pattern extracting method as claimed in claim 22, wherein each apex of the input exposure pattern and each apex of the unit block exposure pattern has first and second adjacent apexes and a corresponding input vector which connects the apex to the first adjacent apex and a corresponding output vector which connects the apex to the second adjacent apex, the corresponding input vector and corresponding output vector of each apex being a set of input/output vectors corresponding to the apex, said determining step comprises:

determining whether or not positions of the apexes of the input exposure pattern with respect to an arbitrary apex of the input exposure pattern coincide with positions of the apexes of the unit block exposure pattern with respect to the reference point; and determining whether or not a plurality of sets of input/output vectors corresponding to apexes of the input exposure pattern coincide with a plurality of sets of input/output vectors corresponding to apexes of the unit block exposure pattern.

24. The pattern extracting method as claimed in claim 22, wherein said determining step comprises:

determining whether or not positions of the apexes of the input exposure pattern with respect to an arbitrary apex of the input exposure pattern coincide with positions of the apexes of the unit block exposure pattern with respect to the reference point; and determining whether or not the number of the apexes of the input exposure pattern is equal to the number of the apexes of the unit block exposure pattern.

25. The pattern extracting method as claimed in claim 22, wherein each apex of the input exposure pattern has first and second adjacent apexes and a corresponding input vector which connects the apex to the first adjacent apex and a corresponding output vector which connects the apex to the second adjacent apex, the corresponding input vector and corresponding output vector of each apex being a set of input/output vectors corresponding to the apex, and the reference point of the unit block exposure pattern has first and second adjacent apexes and a corresponding input vector which connects the reference point to the first adjacent apex and a corresponding output vector which connects the reference point to the second adjacent apex, the corresponding input vector and the corresponding output vector of the reference point being a set of input/output vectors corresponding to the reference point, said method further comprising:

comparing a plurality of sets of input/output vectors corresponding to apexes of the input exposure pattern to the set of input/output vectors corresponding to the reference point of the unit block exposure pattern; and determining whether the input exposure pattern coincides with the unit block exposure pattern, the input exposure pattern determined not to coincide with the unit block exposure pattern when none of the sets of input/output vectors corresponding to apexes of the input exposure pattern coincide with the set of input/output vectors corresponding to the reference point of the unit block exposure pattern.

26. The pattern extracting method as claimed in claim 25, further comprising the step of:

selecting a different set of input/output vectors for comparison by the comparing step when a set of input/output vectors compared in the comparing step and corresponding to a respective apex of the input exposure pattern does not coincide with the set of input/output vectors corresponding to the reference point of the unit block exposure pattern.

27. The pattern extracting method as claimed in claim 25, wherein said step of determining whether or not the first vectors coincide with the second vectors comprises:

determining whether or not positions of the apexes of the input exposure pattern with respect to an arbitrary apex of the input exposure pattern coincide with positions of the apexes of the unit block exposure pattern with respect to the reference point; and replacing a first selected apex of the input exposure pattern for comparison of first vectors in the step of comparing first vectors with a second selected apex for comparison of first vectors in the step of comparing first vectors when the input vector of the first selected apex does not match the input vector of a corresponding apex of the unit block exposure pattern, and also when the output vector of the first selected apex does not match the output vector of the corresponding apex of the unit block exposure pattern.

28. The pattern extracting method as claimed in claim 27, wherein the first selected apex is an end point of an input vector from an adjacent apex and a starting point of an output vector to a different adjacent apex.

29. The pattern extracting method as claimed in claim 28, wherein one of the following conditions is satisfied:

the output vector of the first selected apex is the input vector of the second selected apex, and the input vector of the first selected apex is the output vector of the second selected apex.

30. The pattern extracting method as claimed in claim 27, further comprising the step of:

generating a vector connecting the first selected apex and the second selected apex, the vector having a termination point at which the vector is terminated to enable the input exposure pattern to approximate the unit block exposure pattern.

31. The pattern extracting method as claimed in claim 25, wherein the step of comparing the first vectors of the selected apex of the input exposure pattern with the second vectors of the reference point of the unit block pattern comprises the step of:

initiating the step of determining whether or not the first vectors coincide with the second vectors when the step of determining whether the input exposure pattern coincides with the unit block exposure pattern determines that one of the sets of input/output vectors corresponding to an apex of the input exposure pattern coincides with the set of input/output vectors corresponding to the reference point of the unit block exposure pattern.

32. The pattern extracting method as claimed in claim 25, further comprising the steps of:

specifying a searching area which is a part of an input pattern indicated by input exposure data; and outputting exposure data in the searching area as the input exposure pattern.

33. The pattern extracting method as claimed in claim 32, further comprising the step of:

causing the specifying step to specify a next searching area which partially overlaps a current searching area.

34. The pattern extracting method as claimed in claim 32, wherein the searching area has a size greater than the size of the unit block pattern.

35. The pattern extracting method as claimed in claim 25, wherein an angle between the input vector corresponding to the reference point and the output vector corresponding to the reference point is greater than 90°.

36. A pattern extracting method which is applied to a charged-particle beam exposure system for extracting an input exposure pattern corresponding to a unit block pattern, the input exposure pattern including a plurality of apexes, a selected apex of the input exposure pattern having first vectors connecting the selected apex to other apexes of the input exposure pattern, the unit block exposure pattern including a plurality of apexes, one of the plurality of apexes of the unit block exposure pattern being a reference point having second vectors connecting the reference point to other apexes of the unit block exposure pattern, said pattern extracting method comprising:

comparing, for each unit block exposure pattern of a plurality of unit block exposure patterns, the first vectors of the selected apex of the input exposure pattern with the second vectors of the reference point of the unit block exposure pattern;

determining, for each unit block exposure pattern of which the comparing step compares first vectors, whether or not the first vectors of the input exposure pattern coincide with the second vectors of the unit block exposure pattern; and extracting the input pattern as a respective unit block exposure pattern of the plurality of unit block exposure patterns when the determining step determines that the first vectors of the input exposure pattern coincide with the second vectors of the respective unit block exposure pattern of the plurality of unit block exposure patterns.

37. The pattern extracting method as claimed in claim 36, further comprising the step of:

simultaneously comparing, for each of the plurality of unit block exposure patterns, the first vectors of the input exposure pattern with the second vectors of the unit block exposure pattern.

38. The pattern extracting method as claimed in claim 36, wherein the extracted input exposure pattern is formed by corresponding exposure data, the pattern extracting method further comprising the step of:

replacing the exposure data.

39. A pattern comparing apparatus which is applied to a charged-particle beam exposure system for extracting an input exposure pattern corresponding to a unit block exposure pattern, the input exposure pattern including a plurality of apexes, each apex of the input exposure pattern has first and second adjacent apexes and a corresponding input vector which connects the apex to the first adjacent apex and a corresponding output vector which connects the apex to the second adjacent apex, the unit block exposure pattern including a plurality of apexes, one of the plurality of apexes of the unit block exposure pattern being a reference point having first and second adjacent apexes and a corresponding input vector which connects the reference point to the first adjacent apex and a corresponding output vector which connects the reference point to the second adjacent apex, said pattern comparing apparatus comprising:

first comparator means for comparing an input vector and an output vector of the input exposure pattern with the input vector and the output vector corresponding to the reference point of the unit block exposure pattern;

first determining means for determining whether or not the input vector and the output vector of the input exposure pattern compared by the first comparator means coincide with the input vector and the output vector corresponding to the reference point of the unit block exposure pattern; and second comparator means for comparing vectors related to the input exposure pattern but not including the input vectors and output vectors of the unit block exposure pattern, with vectors related to the unit block exposure pattern but not including the input vector and output vector corresponding to the reference point of the unit block exposure pattern, to determine whether the input exposure pattern is extractable as the unit block exposure pattern.

40. The pattern comparing apparatus as claimed in claim 39, further comprising:

second determining means for determining that the input exposure pattern is extractable as the unit block exposure pattern when the vectors related to the input exposure pattern and compared by the second comparator means coincide with the vectors related to the unit block exposure pattern and compared by the second comparator means.

41. A pattern comparing method which is applied to a charged-particle beam exposure system for extracting an input exposure pattern corresponding to a unit block exposure pattern, the input exposure pattern including a plurality of apexes, each apex of the input exposure pattern has first and second adjacent apexes and a corresponding input vector which connects the apex to the first adjacent apex and a corresponding output vector which connects the apex to the second adjacent apex, the unit block exposure pattern including a plurality of apexes, one of the plurality of apexes of the unit block exposure pattern being a reference point having first and second adjacent apexes and a corresponding input vector which connects the reference point to the first adjacent apex and a corresponding output vector which connects the reference point to the second adjacent apex, said pattern comparing method comprising:

a first comparing step of comparing an input vector and an output vector of the input exposure pattern with the input vector and the output vector corresponding to the reference point of the unit block exposure pattern;

determining whether or not the input vector and the output vector of the input exposure pattern compared by the first comparing step coincide with the input vector and the output vector corresponding to the reference point of the unit block exposure pattern; and a second comparing step of comparing vectors related to the input exposure pattern but not including the input vectors and output vectors of the unit block exposure pattern, with vectors related to the unit block exposure pattern but not including the input vector and output vector corresponding to the reference point of the unit block exposure pattern, to determine whether the input exposure pattern is extractable as the unit block exposure pattern.

42. The pattern comparing method as claimed in claim 41, further comprising the step of:

determining that the input exposure pattern is extractable as the unit block exposure pattern when the vectors related to the input exposure pattern and compared by the second comparing step coincide with the vectors related to the unit block exposure pattern and compared by the second comparing step.

\* \* \* \* \*

UNITED STATES PATENT AND TRADEMARK OFFICE
CERTIFICATE OF CORRECTION

PATENT NO. : 5,590,048
DATED : Dec. 31, 1996
INVENTOR(S) : ABE et al.

It is certified that error appears in the above-indentified patent and that said Letters Patent is hereby corrected as shown below:

TITLE PAGE: [57] ABSTRACT, line 3, change "stats" to --slits--.

Col. 1,   line 57, change "11." to --11,--.

Col. 3,   line 27, change "block pat tern data" to --block pattern data--.

Col. 9,   line 59, after "point" insert --Q--.

Col. 11,  line 37, change "frown" to --from--
          line 59, change "Dour" to --Dout--.

Col. 12,  line 21, change "unit, block" to --unit block--.

Col. 13,  line 15, change "dill" to --din--;
          line 45, change "XPU1-XPU100" to --MPU1-MPU100-.

Col. 15,  line 16, change "dill" to --din--;
          line 46, change "dour-1" to --dout-1--.

Col. 21,  line 63 (claim 29, line 4, after "and" begin a new paragraph with "the input".

Signed and Sealed this

Twentieth Day of May, 1997

Attest:

BRUCE LEHMAN

*Attesting Officer*    Commissioner of Patents and Trademarks